US007283890B2

(12) United States Patent
Iijima et al.

(10) Patent No.: US 7,283,890 B2
(45) Date of Patent: Oct. 16, 2007

(54) WORK CONVEY SYSTEM, UNMANNED CONVEY VEHICLE SYSTEM, UNMANNED CONVEY VEHICLE, AND WORK CONVEY METHOD

(75) Inventors: Toshihiko Iijima, Nirasaki (JP); Shuji Akiyama, Nirasaki (JP); Hiroki Hosaka, Nirasaki (JP); Takashi Nakao, Neyagawa (JP)

(73) Assignee: Tokyo Electron Limited, Tokyo-To (JP)

( * ) Notice: Subject to any disclaimer, the term of this patent is extended or adjusted under 35 U.S.C. 154(b) by 408 days.

(21) Appl. No.: 10/485,969

(22) PCT Filed: Dec. 27, 2002

(86) PCT No.: PCT/JP02/13860

§ 371 (c)(1),
(2), (4) Date: Feb. 6, 2004

(87) PCT Pub. No.: WO03/057806

PCT Pub. Date: Jul. 17, 2003

(65) Prior Publication Data

US 2004/0234362 A1  Nov. 25, 2004

(30) Foreign Application Priority Data

Dec. 27, 2001 (JP) ............... 2001-398607
Feb. 15, 2002 (JP) ............... 2002-038342
Feb. 15, 2002 (JP) ............... 2002-039164

(51) Int. Cl.
 *G06F 7/00* (2006.01)
(52) U.S. Cl. ...................... 700/228; 700/214

(58) Field of Classification Search ................ 700/228, 700/214, 112, 213; 414/940, 935
See application file for complete search history.

(56) References Cited

U.S. PATENT DOCUMENTS 5,577,621 A    11/1996 Yi ............................... 211/41

(Continued)

FOREIGN PATENT DOCUMENTS

JP    06-163667    6/1994

(Continued)

*Primary Examiner*—Khoi H. Tran
(74) *Attorney, Agent, or Firm*—Smith, Gambrell & Russell, LLP

(57) ABSTRACT

There is a jump in the number of devices formed on a single wafer, and it takes a lot of time to inspect a single wafer. In addition, if wafers are inspected every lot, detected wafers remain in staying in a prober until the inspection of all of the wafers is completed. Therefore, the time required to transfer the wafers of each lot to the subsequent step is delayed. As a result, it is difficult to shorten TAT (Turn-Around-Time), and it is difficult to flexibly operate the prober.

A transfer system E according to the present invention includes: a host computer 1; a plurality of probers 2 under the control of the host computer 1; a plurality of RGVs 4 for delivering a wafer W to each of the probers 2, one by one, at its request; and a transfer operating unit 5, associated with the host computer, for operating the RGVs 4. The transfer operating unit 5 has a scheduler 54A and a dispatcher 54B, for preparing an operating schedule for each of the RGVs 4 on the basis of the relationship in position between each of the probers 2 and each of the RGVs 4, and for determining optimum transfer paths for the RGVs 4, to assign a corresponding one of the RGVs 4 to a corresponding one of the optimum transfer paths.

6 Claims, 25 Drawing Sheets

U.S. PATENT DOCUMENTS

| | | | |
|---|---|---|---|
| 5,867,388 A * | 2/1999 | Okumura et al. | 700/112 |
| 6,351,686 B1 * | 2/2002 | Iwasaki et al. | 700/228 |
| 6,356,804 B1 * | 3/2002 | Conboy et al. | 700/228 |
| 6,604,624 B2 * | 8/2003 | Hirata et al. | 198/494 |
| 6,687,568 B2 * | 2/2004 | Ohtsuka et al. | 700/213 |
| 6,721,626 B2 * | 4/2004 | Tomita et al. | 700/218 |
| 6,733,243 B2 * | 5/2004 | Ogata et al. | 414/217 |
| 6,853,876 B2 * | 2/2005 | Wehrung et al. | 700/230 |
| 6,877,944 B2 * | 4/2005 | Peiter | 414/279 |
| 6,931,303 B2 * | 8/2005 | Chang et al. | 700/228 |
| 2001/0051837 A1 * | 12/2001 | Tateyama et al. | 700/112 |
| 2004/0093116 A1 * | 5/2004 | Mountz | 700/216 |
| 2005/0228525 A1 * | 10/2005 | Brill et al. | 700/112 |

FOREIGN PATENT DOCUMENTS

| | | |
|---|---|---|
| JP | 07-326657 | 12/1995 |
| JP | 10-278782 | 10/1998 |
| JP | 10-303274 | 11/1998 |
| JP | 11-263403 | 9/1999 |
| JP | 11-274264 | 10/1999 |
| JP | 11-322068 | 11/1999 |
| JP | 11-330197 | 11/1999 |
| JP | 2001-156145 | 6/2001 |
| WO | WO97/34742 | 9/1997 |

* cited by examiner

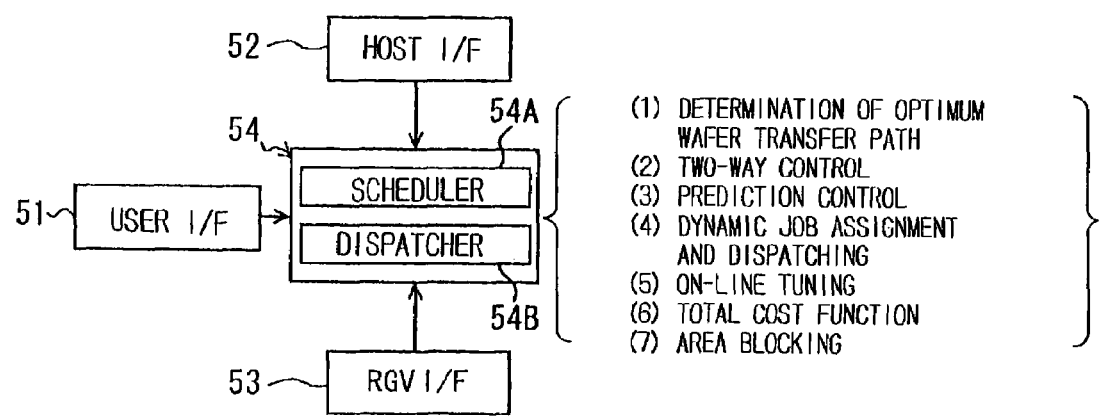
F I G. 2

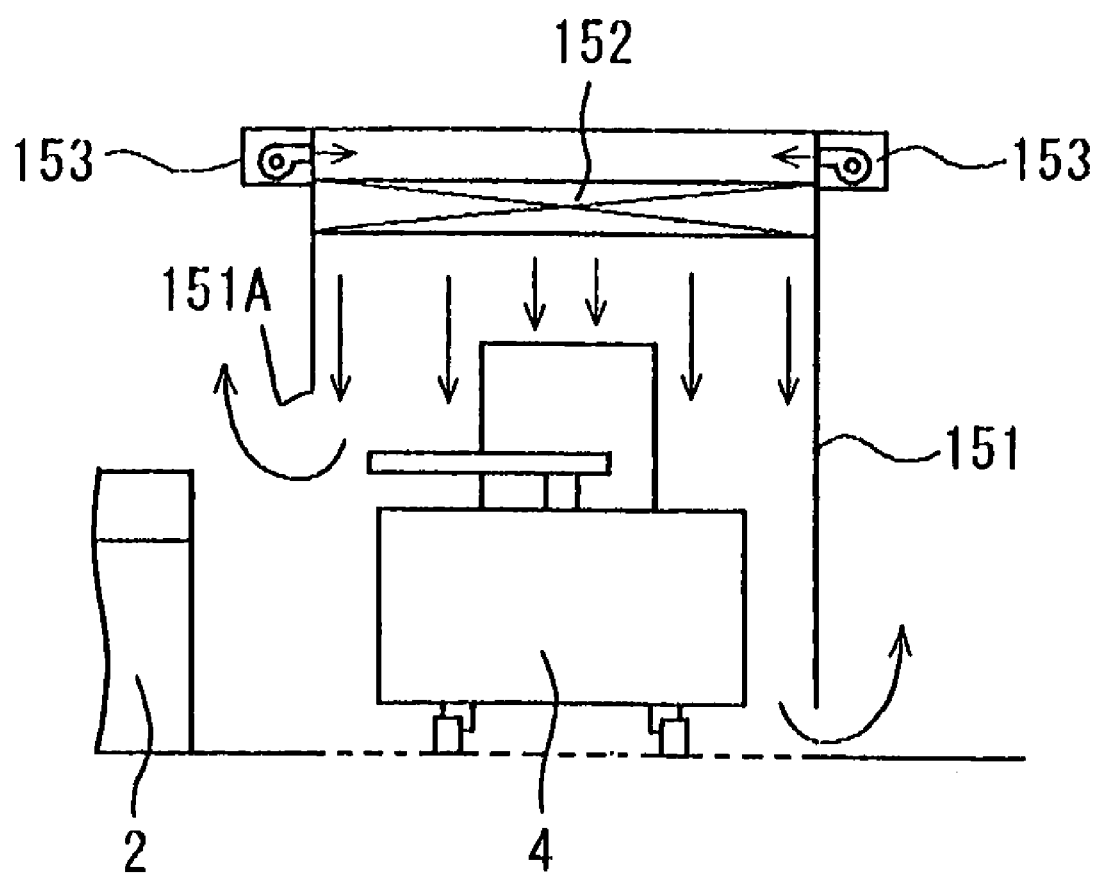
F I G. 4

WORK CONVEY SYSTEM, UNMANNED CONVEY VEHICLE SYSTEM, UNMANNED CONVEY VEHICLE, AND WORK CONVEY METHOD

TECHNICAL FIELD

The present invention relates generally to a transfer system for an object to be processed, an automatic guided vehicle system, an automatic guided vehicle, and a transfer method for an object to be processed. More specifically, the invention relates to a single wafer transfer unit and method for transferring a processing object to a semiconductor producing unit such as an inspecting unit, an automatic guided vehicle system for transporting/transferring a wafer in a semiconductor producing process which processes semiconductor wafers of different sizes, and an automatic guided vehicle on which a single wafer transfer unit is mounted.

BACKGROUND ART

For example, a prober is widely used as an inspecting unit for a semiconductor wafer (which will be hereinafter simply referred to as a "wafer") in an inspecting process for a semiconductor device. A typical prober comprises a loader chamber and a prober chamber for inspecting electric characteristics of a device in a wafer state. The loader chamber comprises: a cassette mounting portion for mounting thereon a cassette which houses therein a plurality of (e.g., twenty five) wafers; a wafer transfer mechanism for transferring one wafer at a time from the cassette mounting portion; and a pre-alignment mechanism (which will be hereinafter referred to as a "sub-chuck") for pre-aligning the wafer which is transferred by means of the wafer transfer mechanism. The prober chamber comprises: a supporting table (which will be hereinafter referred to as a "main chuck") for mounting thereon the wafer to move in X, Y, Z and θ directions; an alignment mechanism which is associated with the main chuck for aligning the wafer; a probe card which is arranged above the main chuck; and a test head which is provided between the probe card and a tester.

Therefore, when an operator intends to inspect a wafer, the operator first mounts a cassette, which houses therein a plurality of wafers every lot, on the cassette mounting portion. Then, when the prober is driven, the wafer transfer mechanism takes one wafer at a time out of the cassette, and the sub-chuck carries out pre-alignment. Thereafter, the wafer transfer mechanism delivers the wafer to the main chuck in the prober chamber. In the prober chamber, the main chuck and the alignment mechanism are associated with each other for pre-aligning the wafer. While the aligned wafer is index-fed by means of the main chuck, the wafer electrically contacts the probe card to inspect predetermined electric characteristics. If the inspection of the wafer is completed, the wafer transfer mechanism in the loader chamber receives the wafer on the main chuck to return the wafer to the original place in the cassette, and thereafter, the inspection of the next wafer is repeated by the above described procedure. If the inspection of all wafers in the cassette is completed, the operator exchanges the wafer for the next wafer to repeat the above described inspection for the new wafer.

However, if wafers have a large diameter of, e.g., 300 mm, the cassette housing therein a plurality of wafers is very heavy, so that it is next to impossible for an operator to carry the cassette. Even if the operator can carry the cassette, there is a risk when the operator carries the cassette alone since it is heavy. In addition, since the particle control in a clean room is increasingly severe with the scale down of semiconductor devices, it is increasingly important to automate manufacturing facilities for cassette transfer and so forth in view of particle control in a clean room. This can be generally applied to semiconductor producing units in addition to probers.

Moreover, there is a jump in the number of devices formed on a single wafer with the increase in diameter of wafers and with the scale down of wafers, and it takes a lot of time to complete processing, such as inspection, with respect to one wafer. In addition, if wafers are processed every lot, processed wafers remain in the prober until the processing of all of the wafers is completed. Therefore, the time required to transfer the wafers of each lot to the subsequent step is delayed. As a result, there is a problem in that it is difficult to shorten TAT (Turn-Around-Time), so that it is difficult to flexibly operate the prober.

Conventionally, there is know an automatic guided vehicle system for transferring each cassette to a large number of processing units, which are provided along a transfer path, by means of an automatic guided vehicle supporting thereon a transfer unit for transferring a cassette which is provided with a large number of shelves for supporting thereon semiconductor wafers. Each processing unit of this system is provided with a single wafer transfer unit for taking a semiconductor wafer at a time out of the mounted cassette to transfer the wafer to each processing portion. Therefore, since the number of processing units increases as the scale of the system increases, there is a problem in that it is required to increase the number of single wafer transfer units. In addition, since the kind of the processing unit varies in accordance with the kind of processing when the multi-product small-scale production is carried out, it is required to feed, e.g., a cassette capable of housing therein twenty five wafers, to each processing unit even if the number of semiconductor wafers to be processed is one or two. Thus, it is required to provide a large number of cassettes, so that there is a problem in that the size of a stocker for housing therein the cassette must be large.

Therefore, it has been studied that a buffer cassette having a large number of shelves for supporting thereon semiconductor wafers, and a single wafer transfer unit are mounted on an automatic guided vehicle to sequentially feed the semiconductor wafers into the buffer cassette from a cassette, which is mounted on a station of a stocker, by means of the single wafer transfer unit to carry the buffer cassette to a target processing unit to transfer the semiconductor wafers directly to the processing unit.

In such a system, the buffer cassette for housing therein the semiconductor wafers is fixed to the automatic guided vehicle. However, with respect to the size (diameter) of semiconductor wafers, 12-inch wafers capable of increasing the number of products have been provided in addition to conventional 8-inch wafers. Cassettes for housing therein only 8-inch semiconductor wafers and cassettes for housing therein only 12-inch semiconductor wafers have been produced on the basis of the SEMI standard. There are some cases where a factory includes a processing line for 8-inch wafers, a processing line for 12-inch wafers, and a processing line for 8-inch and 12-inch wafers. Although conventional processing lines are processing lines only for 8-inch wafers, there is some possibility that the layout of the processing line may be changed to that of a parallel line for 8-inch and 12-inch wafers or a processing line only for 12-inch wafers.

Therefore, there is a problem in that an automatic guided vehicle only for 8-inch wafers and an automatic guided vehicle only for 12-inch wafers can not be applied to a processing line including 8-inch and 12-inch wafers, and can not cope with the variation in size of wafers in accordance with the change of layout.

In addition, since the single wafer transfer unit is designed to pick a wafer up to transfer the wafer, the robot hand portion of the single wafer transfer unit is movable in vertical directions with respect to the vehicular body. Therefore, the robot hand portion is designed to move in vertical directions with respect to the ceiling plate of the automatic guided vehicular body.

The ceiling plate has an opening for allowing the passage of the robot hand portion in vertical directions, and a gap is formed between the ceiling plate and the single wafer transfer unit for vertically moving the robot hand portion with respect to the ceiling plate. When the robot hand portion moves downwards, air is discharged upwards from the gap. At this time, dust produced in the lift driving portion of the robot hand arranged in the automatic guided vehicular body is raised, so that there is a problem in that the raised dust adheres to the wafer supported on the robot hand.

In order to prevent the adhesion of dust, it is considered that a retractable protective cover, e.g., a bellow-like protective cover, is provided between the ceiling plate and the robot hand portion to cover the gap regardless of the vertical movement of the robot hand portion. However, with this construction, the protective cover causes dust.

DISCLOSURE OF THE INVENTION

It is therefore an object of the first invention to provide a processing object transfer system and method capable of automating a processing object transfer operation without the need of any operators to enhance safety, and capable of flexibly operating a semiconductor producing unit, such as an inspecting unit, to realize the shortening of TAT of the processing object.

It is an object of the second invention to provide an automatic guided vehicle system capable of being applied even if a processing line is a line for processing wafers of different sizes or even if wafers to be processed are changed by layout change.

It is an object of the third invention to provide an automatic guide vehicle capable of preventing dust, which is produced in a driving portion, such as a lift driving portion, of a single wafer transfer unit, from adhering to a wafer.

In order to accomplish the above described objects, according to the first invention, there is provided a transfer system for an object to be processed, the system comprising: a host computer for managing production of a semiconductor device; a plurality of semiconductor producing units for producing a semiconductor device from an object to be processed, under control of the host computer; a plurality of automatic transfer units, each of which automatically transfers the object along the same trajectory to deliver the object to a corresponding one of the semiconductor producing units, one by one, at the request of the corresponding one of the semiconductor producing units; and a transfer operating unit, associated with the host computer, for operating the plurality of automatic transfer units, wherein the transfer operating unit has a control part having a scheduler and dispatcher for preparing an operating schedule for each of the automatic transfer units on the basis of the relationship in position between each of the semiconductor producing units and each of the automatic transfer units, for determining optimum transfer paths for the automatic transfer units, and for assigning a corresponding one of the automatic transfer units to a corresponding one of the optimum transfer paths.

In the transfer system for an object to be processed, according to the invention, the scheduler and dispatcher may control movement of each of the automatic transfer units in both directions.

In the transfer system for an object to be processed, according to the invention, the scheduler and dispatcher may predict a moving time for each of the automatic transfer units.

In the transfer system for an object to be processed, according to the invention, the scheduler and dispatcher may dynamically assign each of the automatic transfer units in accordance with an operating condition of each of the semiconductor producing units.

In the transfer system for an object to be processed according to the invention, the scheduler and dispatcher may assign each of the automatic transfer units to a corresponding one of the optimum transfer paths in view of a delivery preference of the object and a moving time of a corresponding one of the automatic transfer units.

In the transfer system for an object to be processed, according to the invention, the scheduler and dispatcher may set a transfer prohibited area on the trajectory.

In the transfer system for an object to be processed, according to the invention, the transfer operating unit may have the function of simulating the transfer of the object by each of the automatic transfer units.

In the transfer system for an object to be processed, according to the invention, the automatic transfer unit may have an identification means for identifying the kind of the object.

In the transfer system for an object to be processed, according to the invention, the automatic transfer unit may have means for positioning the object when the object is delivered.

In the transfer system for an object to be processed, according to the invention, the semiconductor producing unit may be an inspecting unit.

According to the first invention, there is provided a transfer method for an object to be processed, wherein each of a plurality of automatic transfer units supports thereon the object to transfer the object along the same trajectory at the request of a corresponding one of semiconductor producing units for producing a semiconductor device from the object and wherein the object is delivered between a corresponding one of the automatic transfer units and the corresponding one of the semiconductor units one by one, the method comprising the steps of: preparing an operating schedule for each of the automatic transfer units on the basis of the relationship in position between each of the semiconductor producing units and each of the automatic transfer units; determining an optimum transfer path for each of the automatic transfer units on the basis of the operating schedule; and assigning each of the automatic transfer units to the optimum transfer path.

The transfer method for an object to be processed, according to the invention, may further comprise a step of sequentially predicting a transfer path of each of the automatic transfer units.

The transfer method for an object to be processed, according to the invention, may further comprise a step of dynamically assigning each of the automatic transfer units in accordance with an operating condition of a corresponding one of the semiconductor producing units.

The transfer method for an object to be processed, according to the invention, may further comprise a step of assigning a corresponding one of the automatic transfer units to the optimum transfer path in view of a delivery preference of the object and a moving time of the corresponding one of the automatic transfer units.

The transfer method for an object to be processed, according to the invention, may further comprise a step of setting a transfer prohibited area on the trajectory.

In the transfer method for an object to be processed, according to the invention, the semiconductor producing unit may be an inspecting unit.

In order to accomplish the above described objects, according to the second invention, an automatic guide vehicle system comprises: an automatic guided vehicle for mounting thereon a buffer cassette housing therein one or more wafers and a single wafer transfer unit, for transferring the buffer cassette to a processing unit for processing the wafer, and for transferring the wafer in the buffer cassette to the processing unit by the single wafer transfer unit; and a transfer operation control unit for controlling a transfer operation of the single wafer transfer unit, wherein the transfer operation control unit stores therein a transfer operating program for indicating a transfer operation, which corresponds to each size of the wafer housed in the buffer cassette, to the single wafer transfer unit.

The buffer cassette may have shelves which are provided in parallel, for separately housing therein two kinds or more of wafers, which have different sizes, every size.

The automatic guided vehicle system may further comprise: a table, provided on the automatic guided vehicle, for detachably mounting the buffer cassette on the automatic guided vehicle; buffer cassette holding mechanisms, each of which is provided so as to correspond to each of buffer cassettes of different kinds according to a size of a wafer housed therein, for holding a corresponding one of the buffer cassettes on the table; and a buffer cassette detecting means for detecting the kind of the corresponding one of the buffer cassettes, wherein the transfer operation control unit operates a corresponding one of the buffer cassette holding mechanisms corresponding to the kind of the corresponding one of the buffer cassettes detected by the buffer cassette detecting mechanism.

The automatic guided vehicle system may further comprise: a wafer size detecting mechanism for detecting a size of a wafer housed in the buffer cassette, wherein the transfer operating program has a plurality of element transfer operating programs corresponding to the size of wafers, and the transfer operation control unit selects a corresponding one of the element transfer operating programs corresponding to the detected size of wafer on the basis of results of detection by the wafer size detecting mechanism, and indicates a transfer operation to the single wafer transfer unit in accordance with selected one of the element transfer operating programs.

The wafer size detecting mechanism may detect the size of a housed wafer by detecting the kind of the buffer cassette by the buffer cassette detecting mechanism.

In order to accomplish the above described objects, according to the third invention, there is provided an automatic guided vehicle for mounting thereon a buffer cassette housing one or more wafers and a single wafer transfer unit, to transfer the buffer cassette to a processing unit for processing the wafer, to transfer the wafer in the buffer cassette to the processing unit by the single wafer transfer unit, the automatic guided vehicle comprising: a mounted driving portion; and a suction means, provided in the vicinity of the driving portion, for sucking and removing dust which is produced from and around the driving portion.

The single wafer transfer unit may comprise: a lifting unit having a transfer means; a lift driving portion, forming the driving portion, for vertically moving the lifting unit provided on a base portion mounted on a vehicular body; and a ceiling plate having an opening which allows the lifting unit to pass, the ceiling plate covering an upper portion of the base portion, wherein the suction means has a first suction means for sucking air around a gap between the lifting unit and the opening.

The automatic guided vehicle may further comprise: an aligner for adjusting an attitude of a mounted wafer; wherein the driving portion has an aligner driving portion provided on the aligner, and the suction means has a second suction means for sucking air around the aligner driving portion.

Air sucked by the suction means may be discharged below the vehicular body.

The driving portion may have a traveling driving portion arranged on a bottom of a vehicular body, and an air outlet of the suction means may be arranged above the traveling driving portion.

BRIEF DESCRIPTION OF THE DRAWINGS

FIG. 2 is a block diagram showing the construction of a transfer operating unit shown in FIG. 1;

FIG. 4 is a conceptual drawing showing a cross section of a transfer path of an RGV shown in FIG. 3;

BEST MODE FOR CARRYING OUT THE INVENTION

First, referring to FIGS. 1 through 10, a preferred embodiment of a processing object transfer system and method according to the first invention will be described below.

Figure 1:
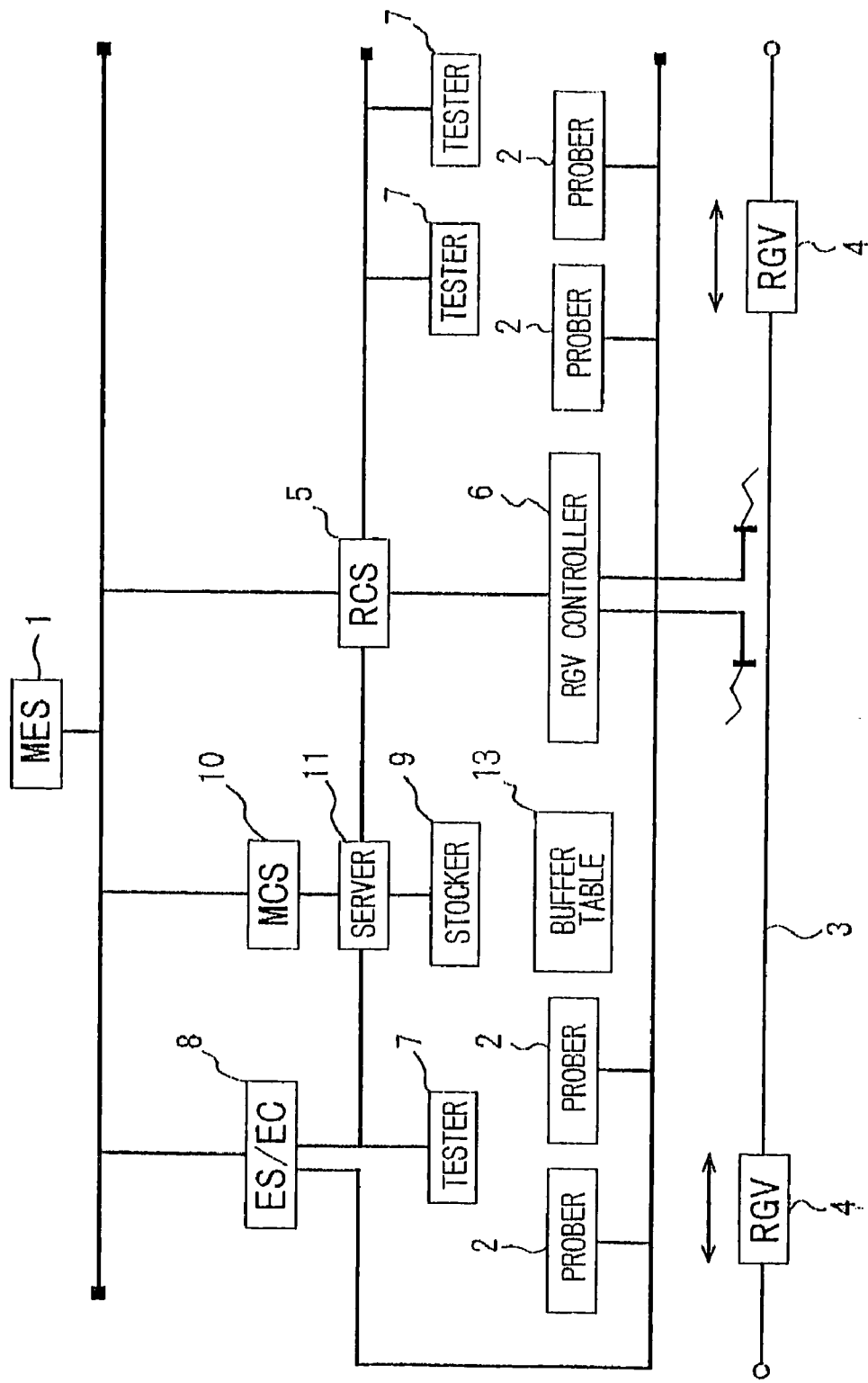
FIG. 1 is a block diagram showing a preferred embodiment of a processing object transfer system according to the first invention.
Figure 3:
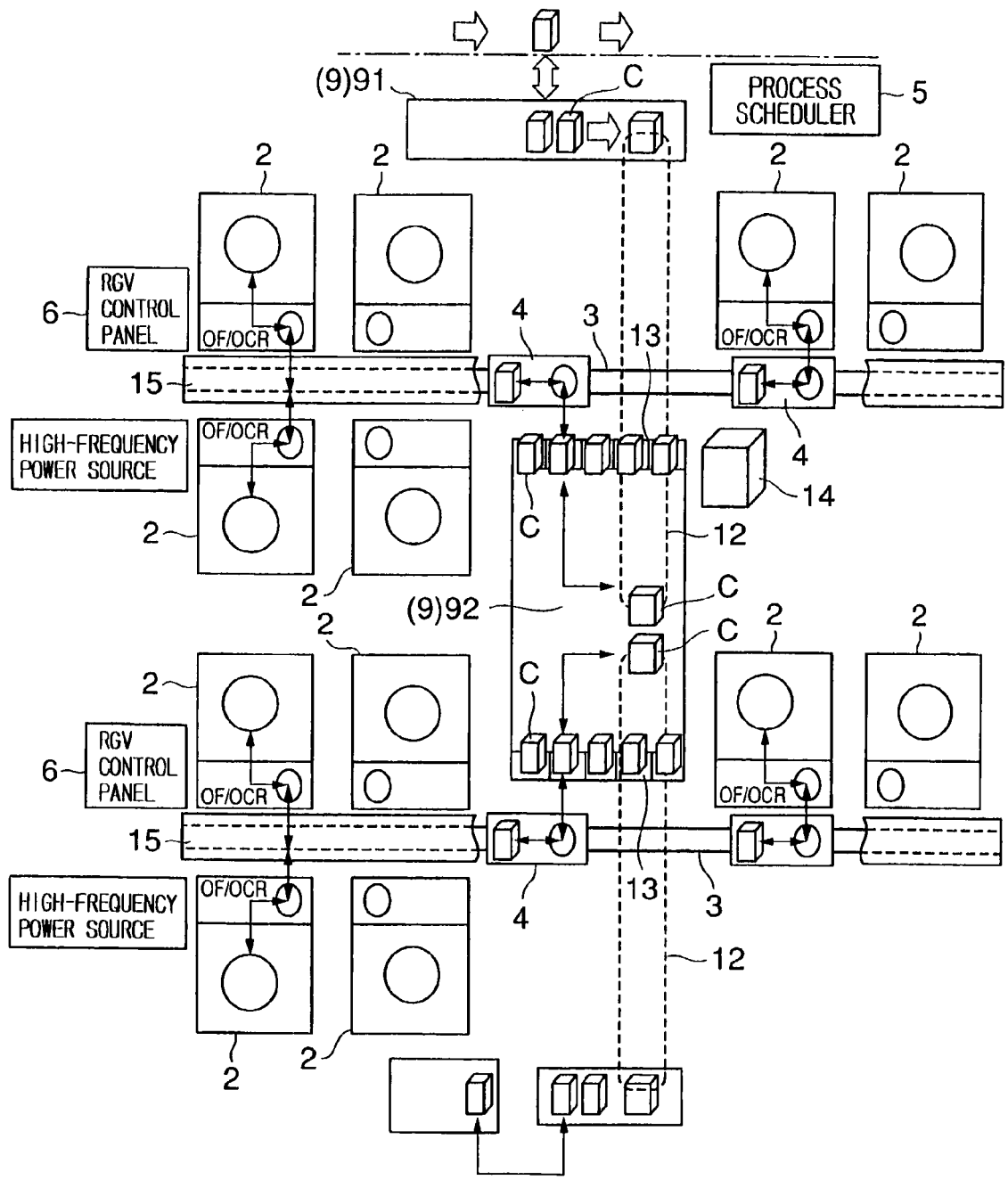
FIG. 3 is an illustration for explaining the layout and movement of each constructive apparatus of the processing object transfer system shown in FIG. 1.

As shown in FIGS. 1 and 3, the processing object transfer system E in this preferred embodiment comprises: a host computer 1 in which an MES (Manufacturing Execution System) for managing production in the whole semiconductor producing factory including an inspecting process for a wafer (not shown) which is an object to be processed, is constructed; a plurality of semiconductor producing units (e.g., probers) 2 which are connected to the host computer 1 via an SECS (Semiconductor Equipment Communication Standard) communication line and which are designed to inspect electric characteristics of wafers under the control of the host computer 1; a plurality of automatic transfer units (which will be hereinafter referred to as single wafer RGVs (Rail Guided Vehicle)) which are designed to automatically transfer wafers in both directions along the same trajectory 3 every cassette in order to deliver the wafers, one by one, to the probers 2 at their request; and a transfer operating unit 5 which is connected to the host computer 1 via the SECS communication line to be associated with the host computer 1 for operating the single wafer RGVs 4 and in which an RCS (RGV Control System) is constructed. The respective constructive apparatuses are network-connected to each other via communication lines. Therefore, since the single wafer RGVs 4 move along the rail 3, the movable region of the single wafer RGVs 4 can be limited to an upper portion, so that it is not required to provide excessive spaces in the movable region of the single wafer RGVs 4 and it is possible to realize space saving. Moreover, since the single wafer RGVs 4 move along the rail 3, the moving speed of the single wafer RGVs can be increased.

The above described prober 2 and single wafer RGV 4 have an optically coupled parallel I/O (which will be hereinafter referred to as "PIO") communication interface (which corresponds to, e.g., 16-bit information processing) based on the SEMI standards E23 and E84, and are designed to carry out a PIO communication to each other for delivering wafers one by one. The prober 2 is formed as a single wafer prober since it receives a wafer at a time to inspect the wafer. The transfer operating unit (RCS) 5 is connected to an RGV controller 6 via the SECS communication line, and the RGV controller 6 is designed to control the single wafer RGV 4 via radio communication under the control of the transfer operating unit 5. The interface and communication method in the PIO communication can be constructed on the basis of the technique described in, e.g., Japanese Patent Application No. 2001-005789.

The above described host computer 1 is connected to a server/controller (ES (Equipment Server)/EC (Equipment Controller)) 8, which is designed to manage and control a tester 7 connected to the prober 2, via the SECS communication line. The host computer 1 is connected to a cassette transfer control unit 10 and its server 11 via the SECS communication line. In the cassette transfer control unit 10, an MCS (Material Control System) for managing and controlling a stocker 9 for handling each cassette, a lifer (not shown) and a ceiling trajectory traveling vehicle (which will be hereinafter referred to as a unit "ceiling vehicle") (not shown) is constructed.

As shown in FIG. 2, the transfer operating unit 5 comprises: a user interface (which will be hereinafter referred to as a "user I/F") 51; a host interface (which will be hereinafter referred to as a "host I/F") 52 for communicating with the host computer 1; an RGV interface (which will be hereinafter referred to as an "RGV I/F") for communicating with the RGV controller 6; and a control part 54 which has a scheduler 54A for preparing an operating schedule to optimally operate the plurality of single wafer RGVs 4 and for determining the optimum transfer path, and a dispatcher 54B for assigning the plurality of single wafer RGVs 4 to the optical transfer path determined by the scheduler 54A. The control part 54 controls commands, such as a movement command and an operation command, for the single wafer RGVs 4. On the basis of these commands, the scheduler 54A and the dispatcher 54B are operated. Both of the host I/F 52 and the RGV I/F 53 are formed as interfaces based on the SEMI standard E82. The transfer operating unit 5 has a simulation function, and can plan the optimum transfer path for the single wafer RGVs 4 without actually moving the single wafer RGVs 4.

Therefore, if the transfer operating unit 5 is operated by inputting transfer information necessary for transfer, such as the layout and number of the probers 2 and single wafer RGVs 4, from an input unit (not shown), a command based on transfer information is inputted to the control part 54 via the user I/F 51. Then, the control part 54 is associated with the host computer 1 for automatically preparing an operating schedule for the single wafer RGVs 4 in the scheduler 54A in accordance with the input command and for retrieving the optimum transfer path. Thereafter, the control part 54 assigns the optimum transfer path to each of the single wafer RGVs 4 in the dispatcher 54B, and communicates the results with the RGV controller 6 via the RGV I/F 53 to move the single wafer RGVs 4 along the optimum transfer path by radio communication from the RGV controller 6. For example, as shown in FIG. 2, the transfer operating unit 5 carries out determination of the optimum transfer path, control of the single wafer RGVs 4 on the rail 3 in both directions, prediction control of transfer, dynamic assignment and dispatching of the single wafer RGVs 4, on-line tuning, calculation of total costs, limitation of the movable region of the single wafer RGVs 4, and so forth on the basis of the operating schedule. These operating contents, together with the method according to the present invention, will be described later.

FIG. 3 more specifically shows a portion directly relating to the operation of the single wafer RGVs 4 of the processing object transfer system E shown in FIG. 1. The plurality of probers 2 are arranged along two rails 3 which are provided at an interval as shown in, e.g., FIG. 3. The probers 2 are arranged on both sides in the left region of each rail 3, and the probers 2 are arranged only one side in the right region of each rail 3. As this layout, the optimum layout is adopted by an inspection process.

As shown in, e.g., FIG. 3, the stocker 9 comprises a main stocker 91 for storing a large number of (e.g., about 200) cassettes C, and a mini stocker 92 for storing a small number of (e.g., about 20) cassettes C which are taken out of the main stocker 91 a little at a time in accordance with the inspection by the prober 2. The main and mini stockers are communicated with each other by the ceiling trajectory 12. In the example shown in FIG. 3, the main stocker 91 is arranged outside of a region in which the probers 2 are arranged, and the mini stocker 92 is arranged between the two rails 3. Moreover, a buffer table 13 is arranged on the mini stocker 92 on the side of the probers 2 for automatically transferring the cassettes C by the ceiling vehicle between the mini stocker 92 and the buffer table 13. Adjacent to the mini stocker 92, a card stocker 14 for storing a plurality of probe cards is arranged. As will be described later, the cassettes C are designed to be capable of being commonly used for a plurality of kinds of wafers W having different diameters (e.g., two kinds of wafers W having diameters of 200 mm and 300 mm).

For example, in semiconductor producing factories, tens probers 2 are arranged. In accordance therewith, two or more rails 3 are provided. Inspection includes a plurality of inspection contents, and there are some cases where the inspection contents are different in accordance with the line of the rail 3. In such cases, if the inspection for each line is completed, the ceiling vehicle is used for transferring the wafers to the next line every cassette.

As shown in, e.g., FIG. 4, the single wafer RGV 4 travels in a clean tunnel 15 to cover a wafer transfer region with clean air. As shown in this figure, the clean air tunnel 15 comprises a tunnel 151, an air filter 152, such as an ULPA filter, provided on the ceiling of the tunnel 151 via a space, and a circulating fan 153 for circulating air in the clean room into the tunnel 151 to hold a cleanliness factor of, e.g., about class 10, in the tunnel 151. The tunnel 151 has a delivery port 151A for delivering wafers between the single wafer RGV 4 and the prober 2. Therefore, while the wafers are transferred by means of the single wafer RGV 4, the wafers are covered with clean air of class 10 to prevent the wafers from being contaminated with particles. If it is required to prepare the RGV for transferring the probe card, to exchange the probe card, the RGV transfers the probe card to a predetermined prober to exchange the probe card.

Figure 5A:
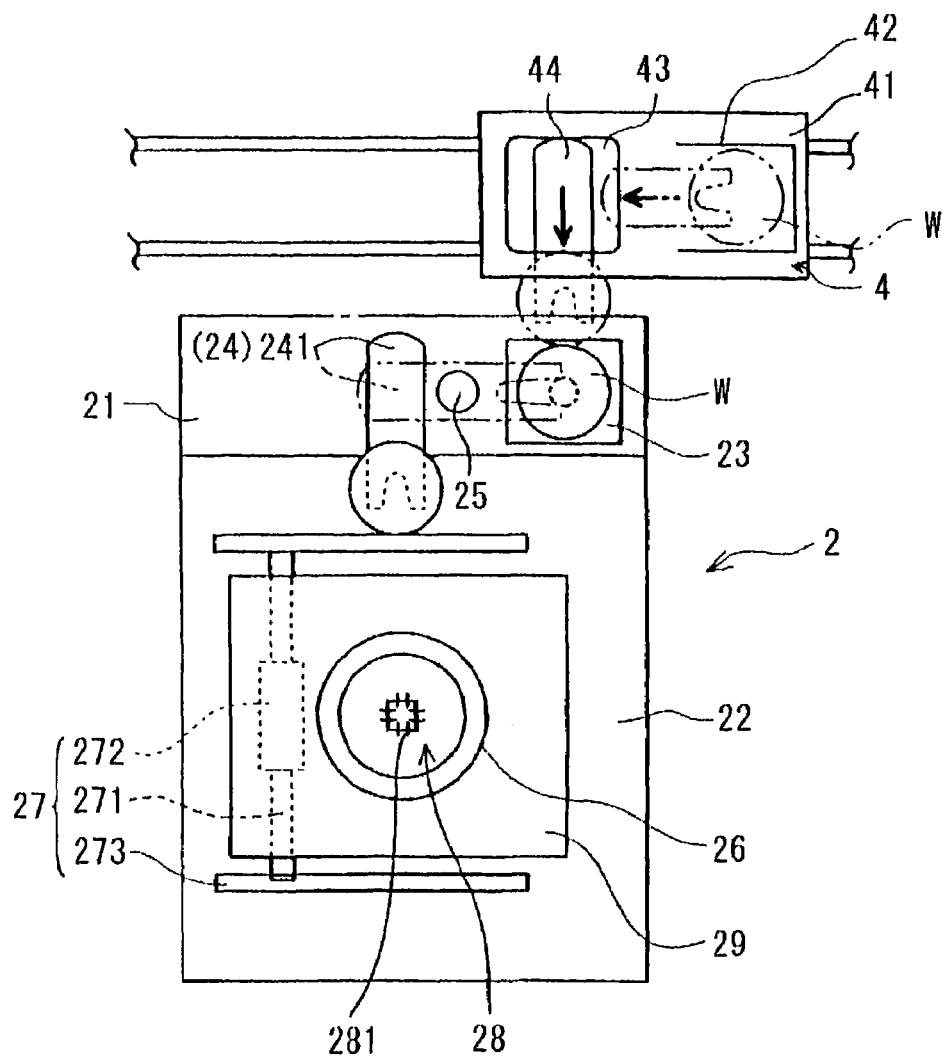
FIGS. 5(a) and 5(b) are illustrations for explaining the delivery of wafers between a prober and the RGV shown in FIG. 3, FIG. 5(a) being a plan view thereof, and FIG. 5(b) being a side view showing its principal portion.
Figure 5B:
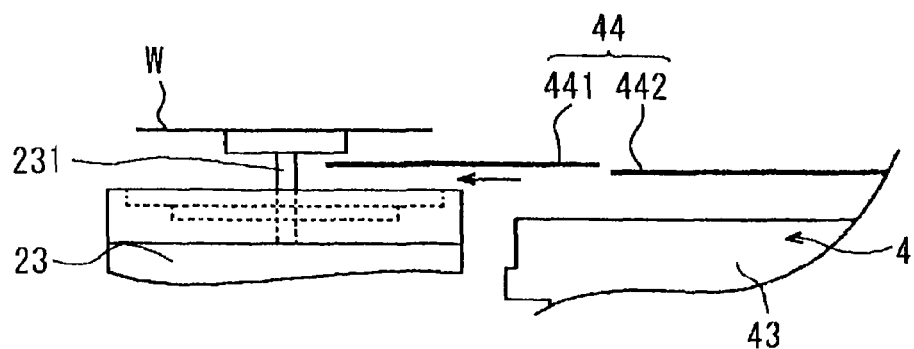

For example, as shown in FIGS. 5(a) and 5(b), the single wafer RGV 4 comprises: an RGV body 41; an obliquely movable buffer cassette 42, provided in the end portion on the RGV body 41, for housing therein twenty five wafers W; a swivel mechanism 43 adjacent to the buffer cassette 42; a wafer transfer mechanism 44 which is provided on the swivel mechanism 43 and which has arms capable of bending and stretching over upper and lower stages; a wafer mapping sensor (not shown) mounted on the wafer transfer mechanism 44; and a flying-out preventing member (not shown) for preventing the wafer W from flying out of the buffer cassette 42. The wafer transfer mechanism 44 has hands 441 and 442 which are mounted on the tips of the arms of the upper and lower stages, and are designed to be vertically movable with the swivel mechanism 43 by means of, e.g., a ball screw mechanism. The flying-out preventing mechanism has a stopper rod engaging a groove formed between upper and lower frames in front of the buffer cassette 42, and a driving mechanism for causing the stopper rod to engage the groove. To prevent the wafer W from flying out of the buffer cassette 42 may be achieved by any one of the obliquely movable mechanism of the buffer cassette 42 and the flying-out preventing member.

Therefore, when the wafer W is delivered between the cassette C of the buffer table 13 and the buffer cassette 42 of the single wafer RGV 4, the swivel and vertical movement of the wafer transfer mechanism 44 are repeated to transfer wafers W, e.g., 25 wafers W, in the cassette C or buffer cassette 42 between the cassette C and the buffer cassette 42 by means of, e.g., the upper hand 441. Then, the single wafer RGV 4 moves to a predetermined position of a target prober 2 along the rail 3 while preventing the wafers W from flying out, and the wafers W are delivered between the single wafer RGV 4 and the prober 2. When this delivery is carried out, the wafers W are delivered from the single wafer RGV 4 to the prober 2 by means of the upper hand 441 of the wafer transfer mechanism 44, and inspected wafers W are received from the prober 2 by means of the lower hand 442.

As shown in FIGS. 5(a) and 5(b), the prober 2 has a loader chamber 21 and a prober chamber 22. The loader chamber 21 comprises; a delivery mechanism (which will be hereinafter referred to as an "adapter") 23 for delivering the wafers W, one by one, between the single wafer RGV 4 and the loader chamber 21; a wafer transfer mechanism 24 for transferring the wafers W between the adapter 23 and the prober chamber 22; and a sub-chuck 25 capable of rotating in forward and reverse directions for pre-aligning the wafers W on the basis of an orientation flat while the wafers W are transferred to the prober chamber 22 by means of the wafer transfer mechanism 24. A wafer W to be inspected is identified by detecting an orientation flat using an orientation flat sensor (not shown) and by reading an ID code applied on the wafer W, while the wafers W are rotated by the sub-chuck 25. As shown in FIG. 5(a), the wafer transfer mechanism 24 has ceramic hands 241 having a forked tip in upper and lower stages. Each of the hands 241 vacuum-holds the wafer W, and allows the delivery of the wafer W by releasing the vacuum holding.

The prober chamber 22 has a main chuck 26 which will be described later, an alignment mechanism 27, and a probe card 28. The main chuck 26 is designed to move in X and Y directions by means of X and X tables 29, and in X and θ directions by means of a lift mechanism (not shown) and a θ rotation mechanism (not shown). As is known, the alignment mechanism 27 has an alignment bridge 271, a CCD camera 272 and a pair of guide rails 273, and is associated with the main chuck 26 for aligning the wafer W with the probe card 28. The probe card 28 has a plurality of probes 281. The probes 281 electrically contact the wafers W on the main chuck 26 to be connected to the tester 7 (see FIG. 1) via a tester head (not shown).

Figure 8:
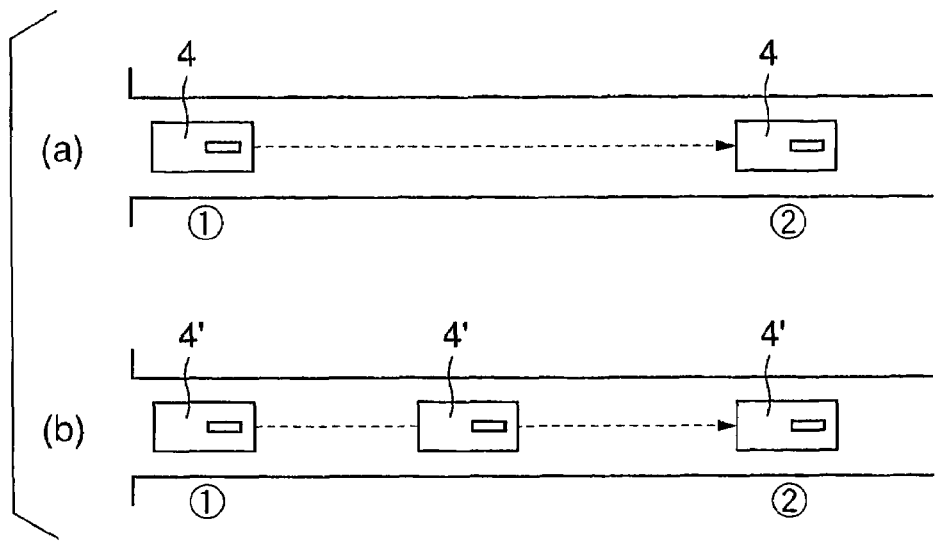
FIGS. 8(a) and 8(b) are illustration for explaining a further preferred embodiment of a processing object transfer method, which correspond to FIGS. 6(a) through 6(c)

Also referring to FIGS. 6 and 8, a preferred embodiment of a processing object transfer method according to the first invention will be described below.

First, transfer information necessary for transfer, such as the layout and number of probers 2 and single wafer RGVs 4, is inputted from an input unit (not shown) of the transfer operating unit 5. Then, if the transfer operating unit 5 is operated, a command based on the transfer information is inputted to the control part 54 via the user I/F 51, and the scheduler 54A of the control part 54 is associated with the host computer 1 for automatically preparing an operating schedule for the single wafer RGVs 4 in accordance with the input command. Moreover, the scheduler 54A determines the optimum transfer path for the current single wafer RGVs 4 among a plurality of transfer paths of the operating schedule. If the optimum transfer path is determined, the dispatcher 54B automatically assigns the plurality of single wafer RGVs 4 to the optimum transfer path. The plurality of single wafer RGVs 4 move along the rail 3 in accordance with the respective assignments in synchronism with each other.

For example, the single wafer RGV 4 receives, e.g., twenty five wafers W, from the buffer table 13 via the wafer transfer mechanism 44. At this time, the wafer transfer mechanism 44 maps the wafers W in the cassette C on the buffer table 13 by means of the mapping sensor, and then, the wafer transfer mechanism 44 transfers the wafers W in the cassette C on the buffer table 13 into the buffer cassette 42 of the single wafer RGV 4. Then, the single wafer RGV 4 moves to a predetermined prober 2 in accordance with the optimum transfer path assigned by the transfer operating unit 5. Thereafter, the wafer transfer mechanism 44 maps the wafers W in the buffer cassette 42, and then, a predetermined wafer W is delivered to the adapter 23 of the prober 2.

When the wafer W is delivered between the wafer transfer mechanism 44 of the single wafer RGV 4 and the adapter 23 of the prober 2, an optical coupled PIO communication is carried out between the prober 2 and the RGV 3. Therefore, the RGV 3 and the prober 2 utilize the PIO communication for precisely delivering a single wafer W.

The delivery operation for a wafer W will be described below. In the single wafer RGV 4, the wafer transfer mechanism 44 moves upwards to take a predetermined wafer W out of the buffer cassette 42 by means of the upper hand 441. Then, after the upper hand 441 is retracted, the wafer transfer mechanism 44 rotates by 90 degrees by means of the swivel mechanism 43 as shown in FIG. 5(*a*), to cause the hand 441 to face the adapter 23 of the prober 2. Subsequently, if the upper hand 441 is extended, the wafer W reaches above the wafer supporting body 231 of the adapter 23. At this time, the wafer supporting body 231 moves upwards. Then, the wafer supporting body 231 vacuum-holds and receives the wafer W from the hand 441 as shown in FIG. 5(*b*) to move downwards.

In the prober 2, as shown in FIG. 5(*a*), the wafer transfer mechanism 24 is driven to cause the hand 241 to enter the adapter 23, and the absorbing pad 242 of the hand 241 vacuum-holds the wafer W. Then, the wafer transfer mechanism 24 transfers the wafer W to the prober chamber 22 after causing the hand 241 to be retracted from the adapter 23. If the wafer W is pre-aligned by the sub-chuck 25 while the wafer W is transferred, the ID code of the wafer W on the sub-chuck is read by means of the OCR. After the pre-alignment, the wafer W is received by the hand 241 of the wafer transfer mechanism 24 again, and thereafter, the hand 241 is caused to face the prober chamber 22.

Meanwhile, the main chuck 26 moves to a stand-by position in the prober chamber 22. Therefore, the wafer transfer mechanism 24 extends the hand 241 to deliver the wafer W to the main chuck 26. If the wafer W is mounted on the main chuck 26, the wafer W is absorbed and fixed to the main chuck 26, so that the wafer W can be inspected. After the inspection is completed, the wafer W is returned into the adapter 23 in the reverse path.

Meanwhile at the latest, or while the wafer W is inspected, the tester 7 sequentially informs the host computer 1 of the inspection status in the prober 2 via the communication line, and the host computer 1 grasps and manages the inspection status. Therefore, if inspection in the prober 2 is completed or if inspection is abnormal, the host computer 1 can instantaneously know it by means of the tester 7, and sequentially informs the transfer operating unit 5 of this information via the communication line. The transfer operating unit 5 updates the operating schedule of the plurality of single wafer RGVs 4 in accordance with the sequentially varying inspection status. Each time, the transfer paths of all of the single wafer RGVs 4 are obtained, and then, the optimum transfer path is determined. At this time, the scheduler 54A and the dispatcher 54B predict a moving time and a delivery executing time in each transfer path, and retrieve and determine the optimum transfer path among the respective transfer paths. Then, the transfer operating unit 5 assigns each single wafer RGV 4 to the optimum transfer path on the basis of the results of determination by means of the controller 6 of the single wafer RGV 4 via radio communication with the single wafer RGV 4, to enhance the operation efficiency of the prober 2 and to shorten the respective operating times of the plurality of single wafer RGV 4 as short as possible.

Figure 6:
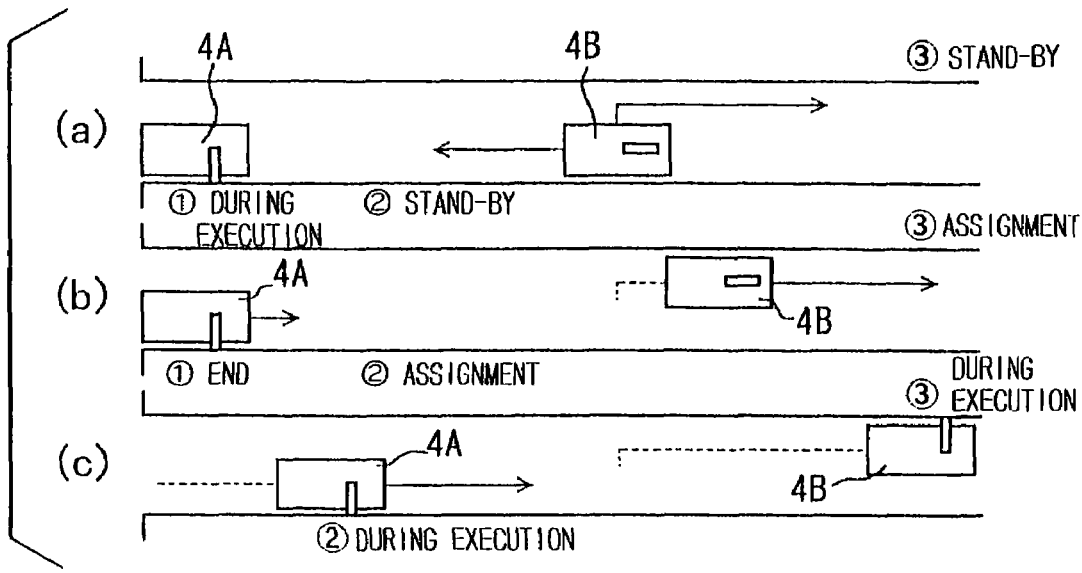
FIGS. 6(a) through 6(c) are illustrations for explaining a preferred embodiment of a processing object transfer method according to the first invention.

For example, it is assumed that two single wafer RGVs 4A and 4B are positioned so as to be adjacent to each other as shown in FIG. 6(*a*), and one single wafer RGV 4A delivers the wafer from and to the prober (not shown), the next wafer waiting in the prober ② adjacent to ①, and the next wafer waiting in the prober ③ far from these probers. The host computer 1 recognizes this inspection status by the notice from the tester 7, and informs the transfer operating unit 5 of this status via the communication line. In the transfer operating unit 5, there is a problem in that any one of ② and ③ is assigned to the other single wafer RGV 4B. Therefore, the transfer operating unit 5 predicts a delivery time between the one single wafer RGV 4A and the prober ①, a moving time of the one single wafer RGV 4A from the current position to ② or ③, and a moving time of the other single wafer RGV 4B from the current position to ② and ③, on the basis of the notice from the host computer 1, and determines whether the optimum transfer pass capable of delivering the wafer in the shortest time if any one of the single wafer RGVs 4A and 4B is assigned to ② and ③. On the basis of this determination, the transfer operating unit 5 assigns the single wafer RGVs 4A and 4B. In this case, it is determined that the optimum transfer pass can be obtained by assigning the one single wafer RGV 4A to the prober ② and by assigning the other single wafer RGV 4B to the prober ③, and the respective single wafers RGV 4A and 4B are thus assigned as shown in FIG. 6(*b*). After the one single wafer RGV 4A completes the delivery in the prober ① on the basis of this assignment, the one single wafer RGV 4A moves to the prober ②, and the other single wafer RGV 4B moves to the prober ③, so that each delivery is carried out as shown in FIG. 6(*c*). Therefore, both of the two single wafer RGVs 4A and 4B are not assigned to the prober ②, and the two single wafer RGVs 4A and 4B do not collide with each other.

Thus, the transfer operating unit 5 can be always associated with the host computer 1 for grasping inspection status in each prober to predict the optimum transfer path for the wafer without the need of any operators to automatically assign the single wafer RGVs 4A and 4B to the transfer path to assign the wafer to each prober in the shortest time. Therefore, it is possible to exclude operators from the transfer line to enhance safety and to contribute to the shortening of TAT, and it is possible to surely prevent the single wafer RGVs 4A and 4B from colliding with each other.

The transfer operating unit 5 is associated with the host computer 1 for sequentially verifying whether the transfer path assigned to the current single wafer RGV 4 in the scheduler 54A and dispatcher 54B of the control part 54 is optimum. Each time, the scheduler 54A updates the operating schedule and retrieves the optimum transfer path, and the dispatcher 54B dynamically assigns the optimum transfer path to each single wafer RGV 4.

Figure 7:
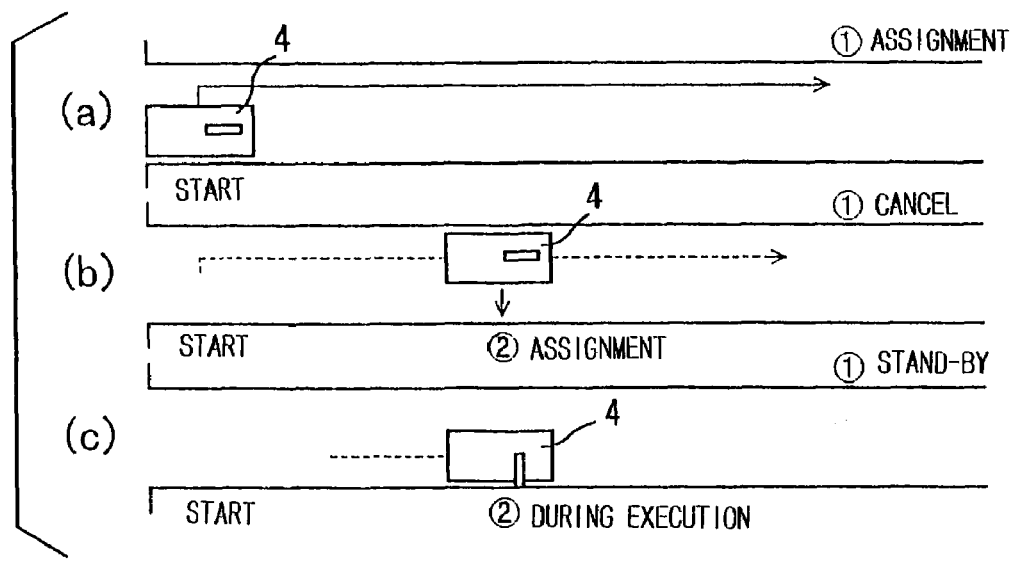
FIGS. 7(a) through 7(c) are illustrations for explaining another preferred embodiment of a processing object transfer method, which correspond to FIGS. 6(a) through 6(c)

For example, if the wafer has defects during inspection in a certain prober 2, it is required to interrupt inspection to replace the wafer with another wafer to prevent the operation efficiency of the prober from deteriorating. If such emergency occurs, the host computer 1 recognizes this fact via the tester 7, and informs the transfer operating unit 5 of this fact. The transfer operating unit 5 updates the operating schedule in the scheduler 54A on the basis of this notice, to retrieve the optimum transfer paths of all of the single wafer RGVs 4, and the dispatcher 54B assigns a single wafer RGV 4, which can transfer the wafer in the shortest time, to the prober. For example, as shown in FIG. 7(*a*), if the above described emergency occurs in the prober ② on the side of the prober ① while the single wafer RGV 4 moves toward the prober ① after it starts to move from the current start position, the transfer pass to the prober ① assigned to the single wafer RGV 4 shown in FIG. 7(*b*) by the scheduler 54A is canceled, and the transfer path to the prober ② is assigned to the single wafer RGV 4 by means of the dispatcher 54B. This single wafer RGV 4 moves toward the prober ② in preference to the prober ①, and delivers the wafer in the prober ① as shown in FIG. 7(*c*). Meanwhile, the prober ① waits for the single wafer RGV 4. If the other RGV (not shown) is empty so that it is effective to assign the RGV to the prober ①, such an operating schedule has been prepared in the scheduler 54A, and the dispatcher 54A assigns the single wafer RGV 4 to the prober ①.

If the single wafer RGV 4 completes the delivery in the prober ② as shown in FIG. 7(*c*), the transfer operating unit 5 assigns this single wafer RGV 4 to the prober ①. At this time, even if another RGV (not shown) has been positioned in the prober ① to which the single wafer RGV 4 is to be moved, the delivering operation of the single wafer RGV 4 is in preference to the other RGV on the basis of the operating schedule, and the other RGV is retracted from that position to be assigned to another transfer path before the single wafer RGV 4 reaches the prober ①. If another prober has delivered the wafer in the prober ① on the basis of the operating schedule, the scheduler 54A updates the operating schedule, and the dispatcher 54B assigns the single wafer RGV 4 to another prober. Thus, the transfer operating unit 5 is always associated with the host computer 1 for dynamically assigning a delivering operation to the single wafer RGV 4 to transfer the wafer in the shortest time.

The transfer operating unit 5 is associated with the host computer 1 in the scheduler 54A and dispatcher 54B for determining the next handling in accordance with the results of inspection of the wafer assigned by the single wafer RGV 4. For example, the transfer operating unit 5 receives the notice of the results of inspection in the prober 2 from the host computer 1, to collect defective wafers or the like and to use it for reinspection. If inspection in a certain prober is interrupted due to a defective wafer or the like, the defective wafer is collected after the next wafer is delivered by the single wafer RGV 4. In accordance with the status at that time, the defective wafer is temporarily stored in a wafer housing portion (not shown) of the adapter 23, and subsequently, the wafer is collected. If a defective wafer is produced in the previous process, a computer (not shown) in the previous process informs the host computer 1 of the lot including the defective wafer, or the lot is inputted to the host computer 1. If the host computer 1 informs the transfer operating unit 5 of this information, the transfer operating unit 5 experimentally assigns the wafers of that lot to the prober 2 on the basis of the operating schedule prepared by the scheduler 54A and dispatcher 54B, and the prober inspects the wafer. The tester 7 informs the host computer 1 of the results of this inspection, and the host computer 1 determines whether it is required to inspect other wafers. The transfer operating unit 5 prepares an operating schedule on the basis of the results of determination by means of the scheduler 54A, and assigns the single wafer RGV 4 by means of the dispatcher 54B to automatically collects the wafer. In some cases, the transfer operating unit 5 prepares an operating schedule for assigning the single wafer RGV 4 in order to reinspect the wafers of that lot, and assigns the optimum transfer path to the single wafer RGV 4.

As described above, the transfer operating unit 5 is associated with the host computer 1 via the communication line for predicting the destinations of the plurality of single wafer RGVs 4 to assign the optimum transfer path to each of the single wafer RGVs 4, so that the plurality of single wafer RGVs 4 move along the respective transfer paths in synchronism with each other. For example, as shown in FIG. 8(*a*), if a transfer path from position ① to position ② is assigned to a certain single wafer RGV 4, one command can move the single wafer RGV 4 from ① to ② at a stroke regardless of other RGVs. Therefore, the high speed performance of the single wafer RGV 4 can be utilized at the maximum. However, conventionally since a plurality of automatic guided vehicles separately move without being synchronized with each other, if an automatic guided vehicle 4' moves from position ① to position ② as shown in, e.g., FIG. 8(*b*), it moves in view of the relationship to other automatic guided vehicles. Therefore, since the automatic guided vehicle 4' must move from ① to ② by a plurality of (two in FIG. 8) moving commands as shown in FIG. 8(*b*), it is difficult to accelerate the automatic guided vehicle 4', so that it is not possible to enhance the transfer efficiency.

The transfer operating unit 5 assigns the single wafer RGV 4 to the optimum transfer pass by means of the dispatcher 54B in view of the delivery preference of the wafer and the moving time of the single wafer RGV 4 in the dispatcher 54B. In order to consider the delivery preference of the wafer and the moving time of the single wafer RGV 4, the scheduler 54A usually retrieves a transfer pass having a shortest moving time of all of the single wafer RGV 4, and assigns the optimum transfer pass to each single wafer RGV 4 so that the total of moving costs of the single wafer RGVs 4 is lowest. However, if a single wafer RGV 4 having an urgent, preferential lot intervenes, a transfer path to an empty prober 2 is selected to assign the single wafer RGV 4 having the high order of priority thereto in preference to other single wafer RGVs 4.

When a prober 2 requiring maintenance occurs, if the prober is inputted by the input unit of the transfer operating unit 5, the scheduler 54A sets a prohibited area to the rail 3 corresponding to the prober 2 so as to prevent the single wafer RGV 4 from moving in the prohibited area. Therefore, even during the operation of the transfer system E, it is possible to surely maintain the prober 2.

By the way, there are some cases where a prober requiring the exchange of a probe card occurs during the operation of the transfer system E. Also in this case, the RGV can be used for transferring the probe card to a target prober to automatically exchange the probe card. Alternatively, the RGV transfers the probe card to an operation region OP of a target prober, and an operator exchange the probe card in the operation region OP. Therefore, since the weighted probe card is transferred by the RGV, it is possible to enhance the safety of the operation efficiency of the probe card.

As described above, according to this preferred embodiment, the scheduler 54A and dispatcher 54B of the transfer operating unit 5 prepare the operating schedule for the plurality of single wafer RGVs 4 to determine the optimum transfer path, assigns each of the single wafer RGVs 4 to each of the optimum transfer paths, and move the single wafer RGVs 4 along the rail 3. Therefore, it is possible to completely automate the transfer of the wafers W to particularly reduce the number of operators, and it is possible to transfer the wafers W in the shortest time by means of the single wafer RGVs 4 to shorten TAT. In addition, since the single wafer RGVs 4 move on the rail 3, it is possible to rapidly transfer the wafers W to contribute to the shortening of TAT, and it is possible to reduce the moving region of the single wafer RGVs 4 to contribute to the space saving for the clean room.

Also, according to this preferred embodiment, since the scheduler 54A and the dispatcher 54B control the movement of the plurality of single wafer RGVs 4 in both directions, it is possible to cause the single wafer RGVs 4 to face the nearest prober 2, and it is possible to transfer the wafers W in a short time. Since the scheduler 54A and the dispatcher 54B predict the moving times of all of the single wafer RGVs 4, respectively, it is possible to efficiently operate the single wafer RGVs 4. Since the scheduler 54A and the dispatcher 54B dynamically assign each of the single wafer RGVs 4 in accordance with the operation status of the prober 2, even if abnormalities or errors occur in the inspection of the wafers W, it is possible to flexibly cope therewith to efficiently operate the single wafer RGVs 4 to transfer the wafers W in a short time. Since the scheduler 54A and the dispatcher 54B assign the plurality of single wafer RGVs 4 to the respective optimum transfer paths in view of the delivery preference of the wafers and the moving times of the single wafer RGVs 4, it is possible to shorten the moving times of all of the single wafer RGVs 4 to the minimum times to save the operation costs for the single wafer RGVs 4, and it is possible to assign the single wafer RGVs 4 in the order of priority. Since the scheduler 54A and the dispatcher 54B set the prohibited area in the rail 3, if it is required to carry out maintenance for a certain prober 2, it is possible to safely carry out the maintenance without moving the single wafer RGV 4 to the rail 3 corresponding to the prober 2. Since the transfer operating unit 5 has the function of simulating the transfer of wafers by means of all of the single wafer RGVs 4, it is possible to plan the optimum transfer paths for the single wafer RGVs 4 without actually moving the single wafer RGVs 4.

Figure 9:
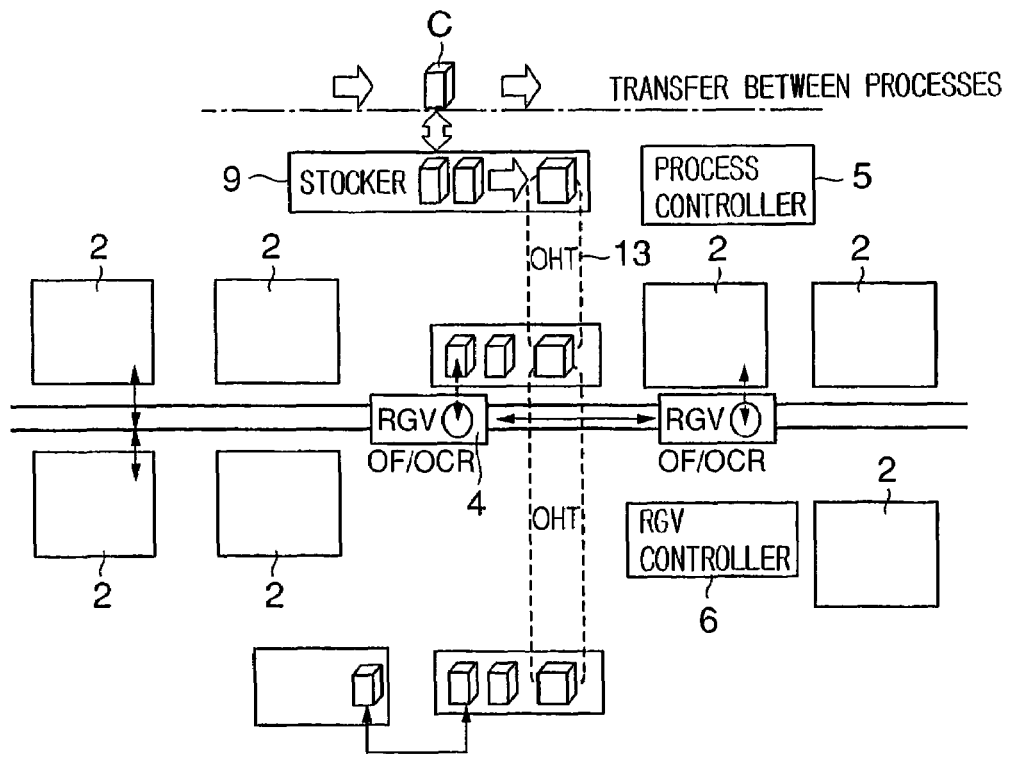
FIG. 9 is an illustration showing another preferred embodiment of a processing object transfer system, which corresponds to FIG. 3.

By the way, while the prober 2 has the loader chamber 21 in the above described preferred embodiment, the loader chamber 21 of the prober 2 shown in FIGS. 3 and 5(a) may be omitted as shown in FIG. 9 to cause the single wafer RGVs 4 to have the wafer loading and unloading functions. If the loading function is given to the single wafer RGVs 4, it is possible to cut the loading and unloading functions of the transfer system to decrease equipment costs. Furthermore, the same reference numbers will be given to the same or corresponding portions as and to those in the above described preferred embodiment.

Figure 10:
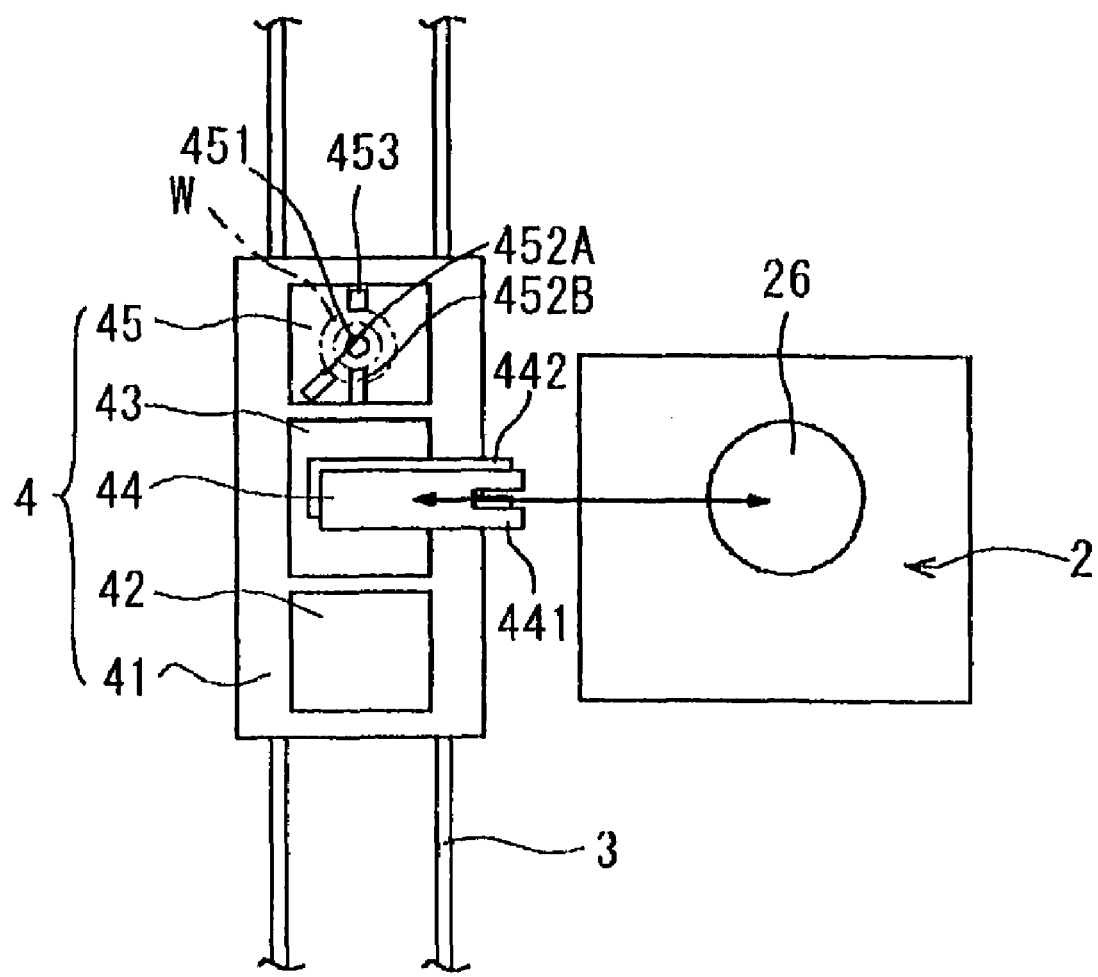
FIG. 10 is an illustration showing a state that a wafer is delivered by the transfer system of FIG. 9, which corresponds to FIGS. 5(a) and 5(b)

As shown in FIG. 10, in a processing object transfer system E in this preferred embodiment, a single wafer RGV 4 has the same construction as that in the above described preferred embodiment, except that loading and unloading functions are provided. The single wafer RGV 4 in this preferred embodiment comprises: an RGV body 41; an obliquely movable buffer cassette 42, provided in the end portion on the RGV body 41, for housing therein twenty five wafers W; a swivel mechanism 43 adjacent to the buffer cassette 42; a wafer transfer mechanism 44 which is provided on the swivel mechanism 43 and which has an arm capable of bending and stretching; and an attitude control mechanism 45 adjacent to the wafer transfer mechanism 44. The wafer transfer mechanism 44 is designed to directly deliver wafers W from and to the main chuck 26 of the prober 2 under the control of the RGV controller 6. The single wafer RGV 4 has the same construction as that in the above described preferred embodiment, except for the attitude control mechanism 45, and a flying-out preventing member and an obliquely movable mechanism prevent the wafers W from flying out of the buffer cassette 42 during the transfer of the wafers W. The single wafer RGV 4 in this preferred embodiment may be formed in accordance with the technique described in Japanese Patent Application No. 2001-121024. Therefore, the details of the single wafer RGV 4 are given to the specification of Japanese Patent Application No. 2001-121024, and the summary thereof will be described below.

The above described attitude control mechanism 45 comprises: a sub-chuck 451 capable of rotating in forward and reverse directions for supporting thereon a wafer W; a plurality of (two in FIG. 10) orientation flat sensors 452A and 452B for detecting the orientation flats of wafers W having different diameters while the sub-chuck 451 rotates in forward and reverse directions; and an OCR 453 for reading an ID code give to each of the wafers W. The wafer transfer mechanism 44 is provided with a mapping sensor (not shown) of a photoelectric sensor which is designed to map the wafers W in the buffer cassette 42 when the wafer Transfer mechanism 44 moves in vertical directions.

Therefore, after the wafer transfer mechanism 44 maps the wafers W in the buffer cassette 42, the single wafer RGV 4 transfer the wafers W to an empty shelf of the buffer cassette 42 from a cassette C on the buffer table 13. Subsequently, the single wafer RGV 4 causes the buffer cassette 42 to incline, and moves a transfer path, which is assigned by the transfer operating unit 5, to a target prober 2 along the rail 3 as shown in FIG. 10.

Then, after the upper hand 441 of the wafer transfer mechanism 44 takes a wafer W out of the buffer cassette 42 under the control of the RGV controller 6, the swivel mechanism 43 rotate it by 180 degrees to extend the hand 441 to insert the wafer W into the attitude control mechanism 45 to mount the wafer W on the sub-chuck 451. After the wafer W is absorbed and fixed to the sub-chuck 451, while the sub-chuck 451 rotates, the orientation flat sensors 452A and 452B detect the trajectory of rotation of the wafer W and orientation flat, respectively. Then, the RGV controller 6 derives a difference between the center of the wafer W and the center of the sub-chuck 451 on the basis of the trajectory of rotation of each of the wafer W and orientation flat when the sub-chuck 451 rotates, and the wafer transfer mechanism corrects the difference to center the wafer W on the sub-chuck 451. Thereafter, the sub-chuck 451 is rotated to read an ID code by means of the OCR 453 and to position the orientation flat of the wafer W in a predetermined direction by the rotation of the sub-chuck 451. The RGV controller 6 informs the transfer operating unit 5 of the read information of the OCR 453 via radio communication, and the transfer operating unit 5 informs the host computer 1 and the tester 7 of this information via the communication line. On the other hand, after the wafer transfer mechanism 44 takes the wafer W on the sub-chuck 41 from the attitude control mechanism 45 by means of the upper hand 441, the swivel mechanism 43 rotates the upper hand 441 by 90 degrees. Then, the lift mechanism moves the upper hand 441 upwards to insert the upper hand 441 into the prober 2 to mount the wafer W on the main chuck 26, and thereafter, the lift mechanism retracts the arm 441.

When the single wafer RGV 4 receives the inspected wafer W from the prober 2, the lower hand 442 of the wafer transfer mechanism 44 is used. In this case, the single wafer RGV 4 receives the wafer W from the main chuck 26 of the prober 2 by means of the hand 442 of the wafer transfer mechanism 44, to house the wafer W at the original position in the buffer cassette 42. Thereafter, the next wafer W is mounted on the main chuck 26 by means of the upper hand 441 as described above.

As described above, according to this preferred embodiment, since the single wafer RGV 4 has the function of loading and unloading the wafer W, it is possible to omit the function of loading and unloading each prober 2, so that it is possible to decrease costs for the prober 2.

The present invention should not be limited to the above described preferred embodiment, and can be suitably modified if necessary. For example, an automatic guided vehicle, such as AGV, may be substituted for the RGV.

As described above, according to the first invention, it is possible to provide a processing object transfer system and method capable of automating a processing object transfer operation without the need of any operators to enhance safety, and capable of flexibly operating a semiconductor producing unit, such as an inspecting unit, to realize the shortening of TAT of the processing object.

Referring to FIGS. 11 through 21, a preferred embodiment of an automatic guided vehicle according to the second invention will be described below.

Figure 11:
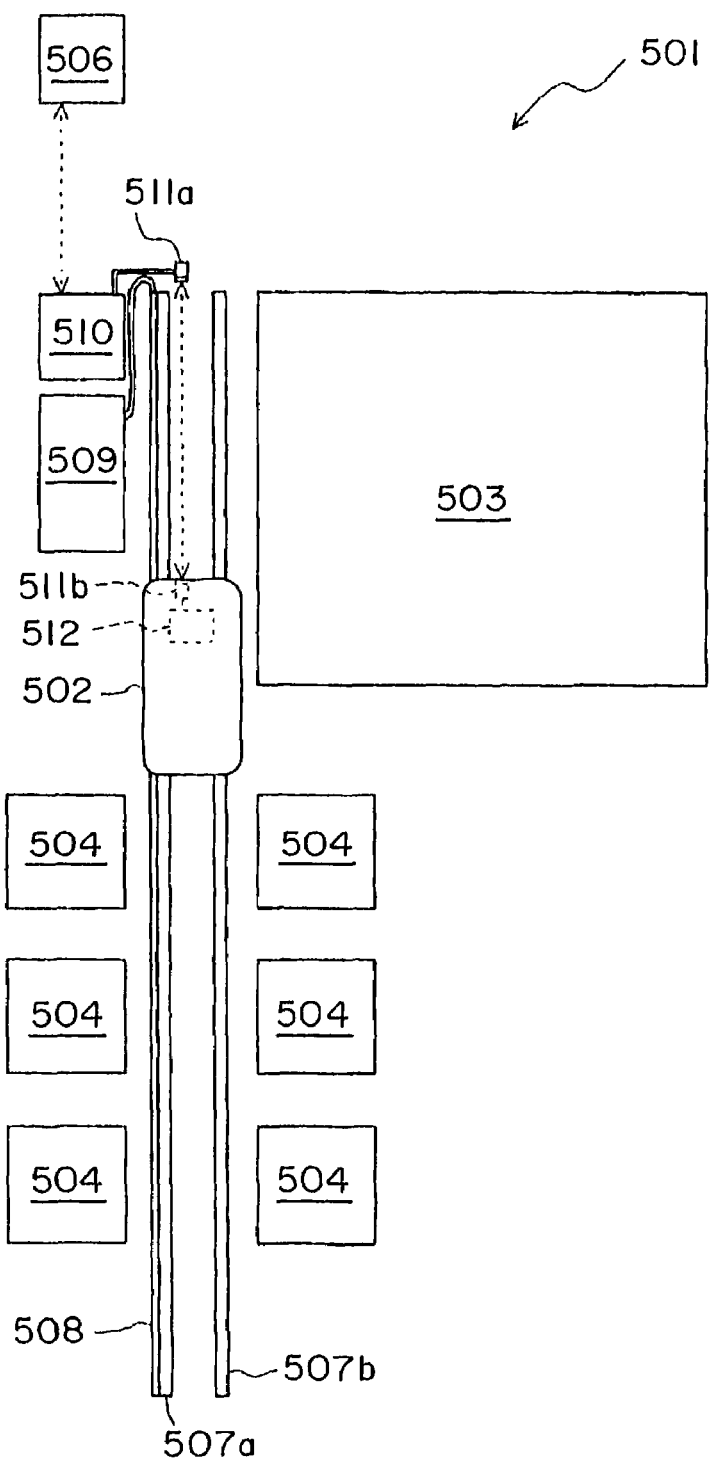
FIG. 11 is a schematic diagram showing a process operation part of a wafer processing operation, to which a preferred embodiment of an automatic guided vehicle according to the second invention is applied.
Figure 12:
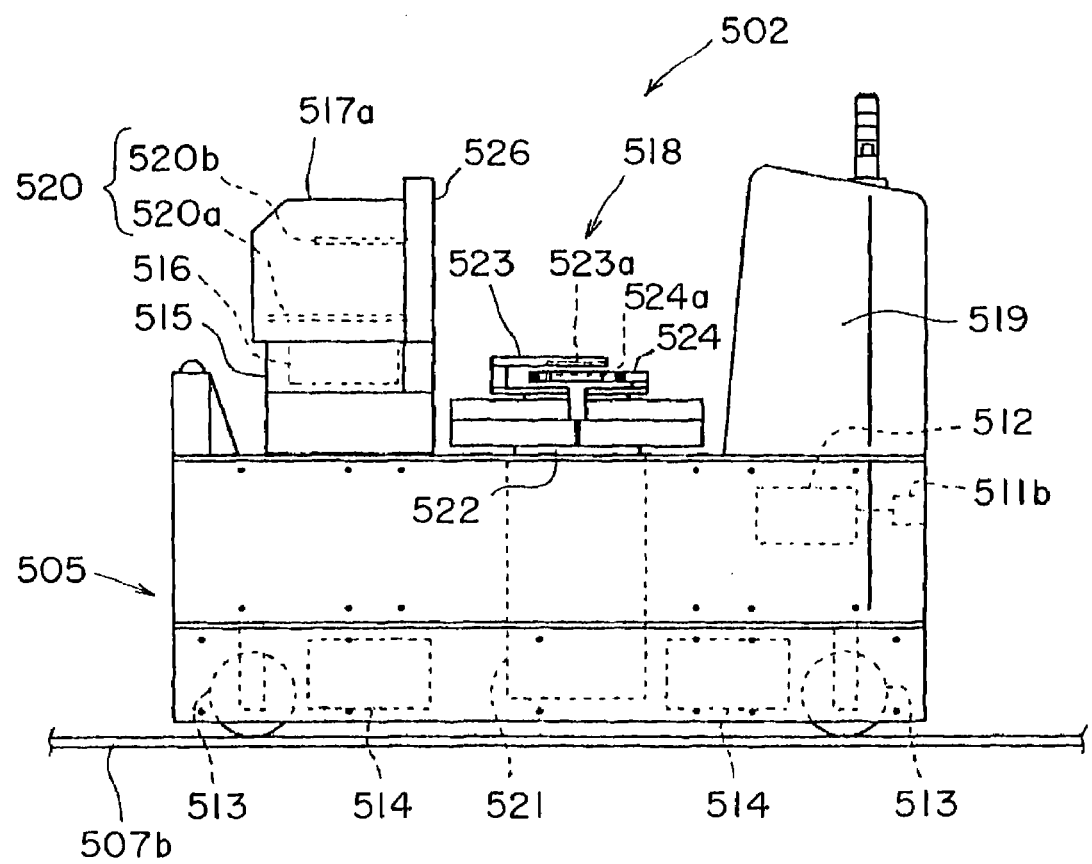
FIG. 12 is a right side view of an automatic guided vehicle.
Figure 13:
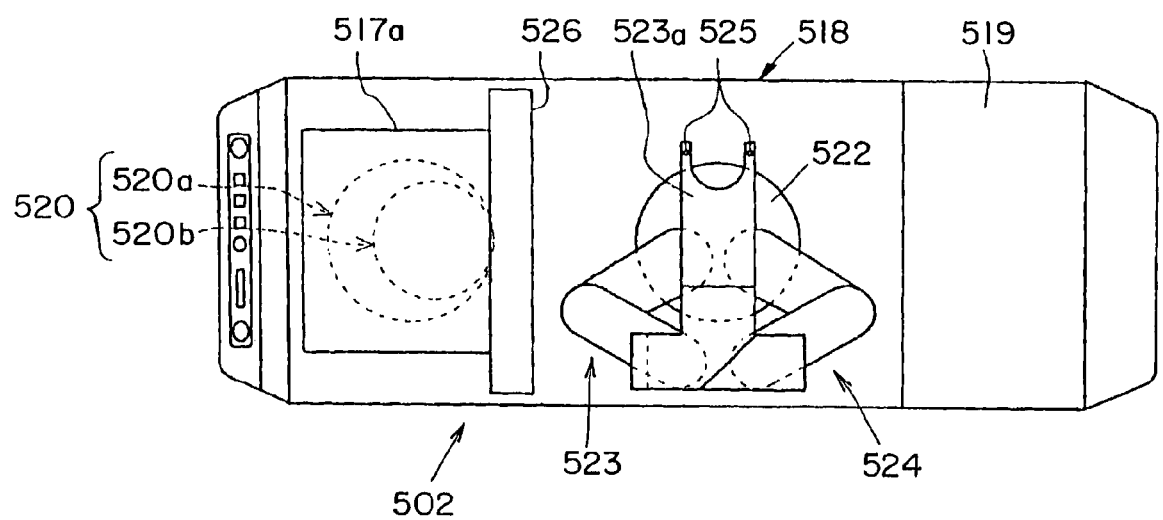
FIG. 13 is a plan view of an automatic guided vehicle.
Figure 14:
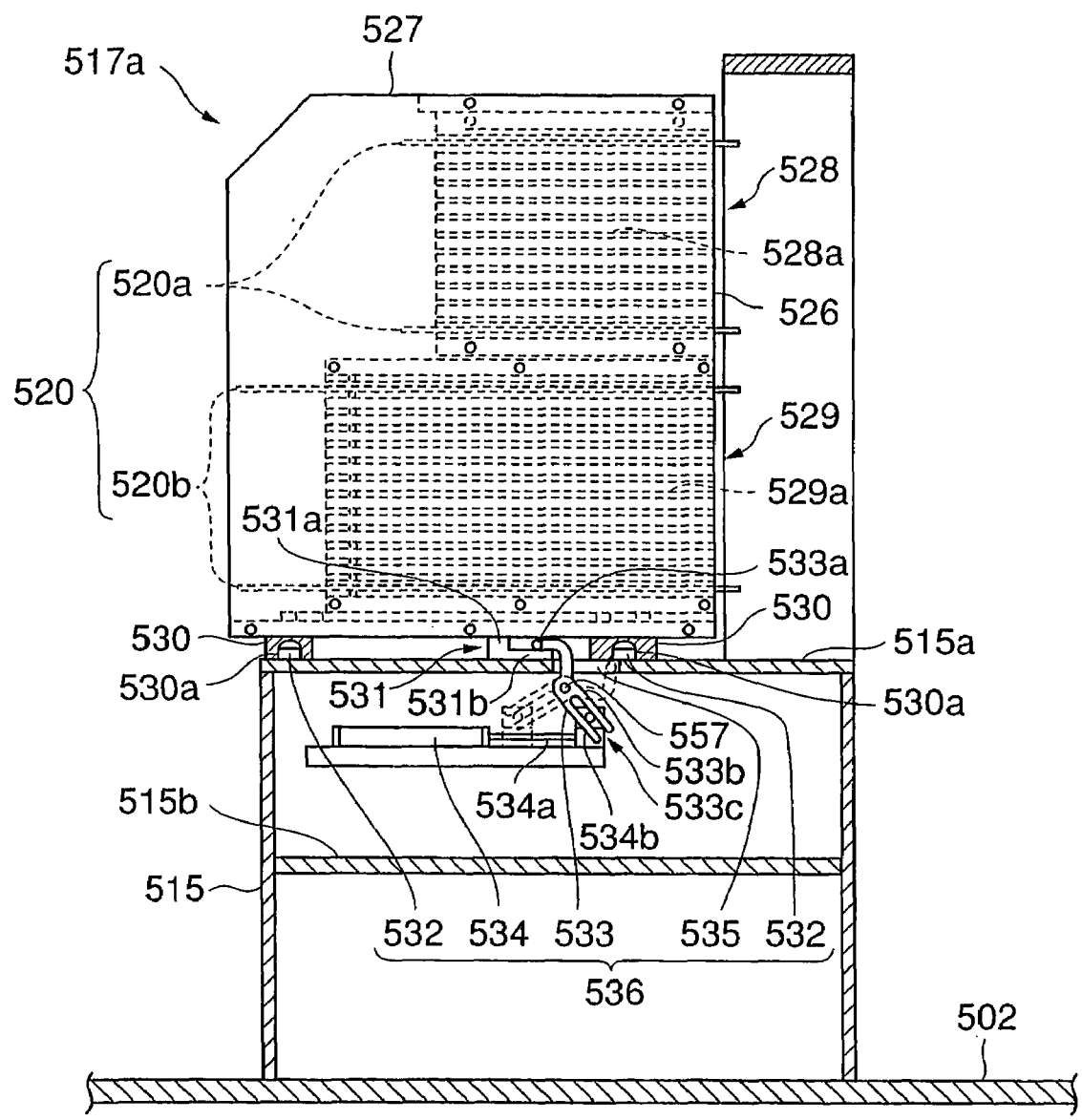
FIG. 14 is a side partially sectional view of a buffer cassette and a buffer cassette table.
Figure 15:
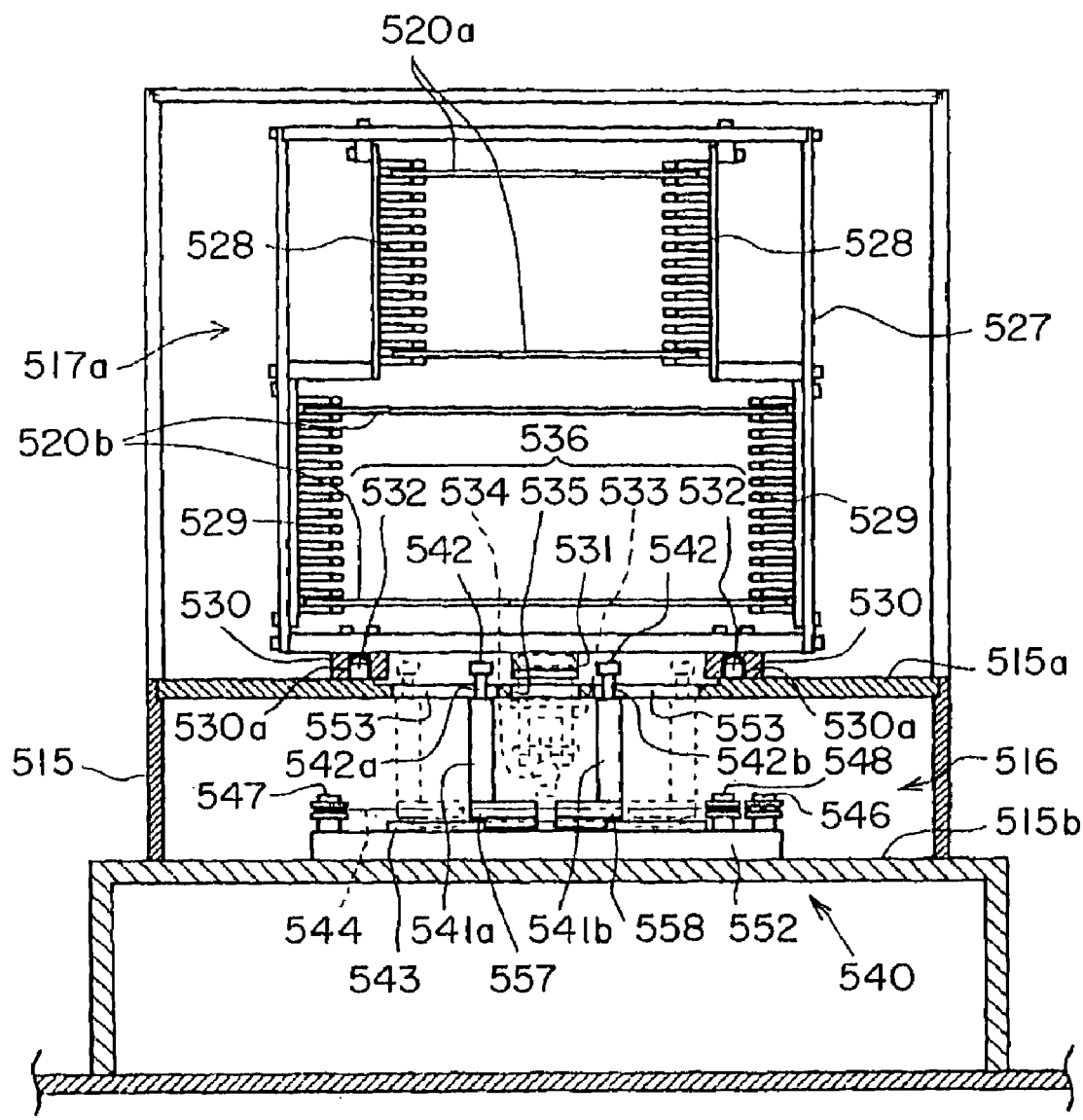
FIG. 15 is a front partially sectional view of a buffer cassette and a buffer cassette table.
Figure 16:
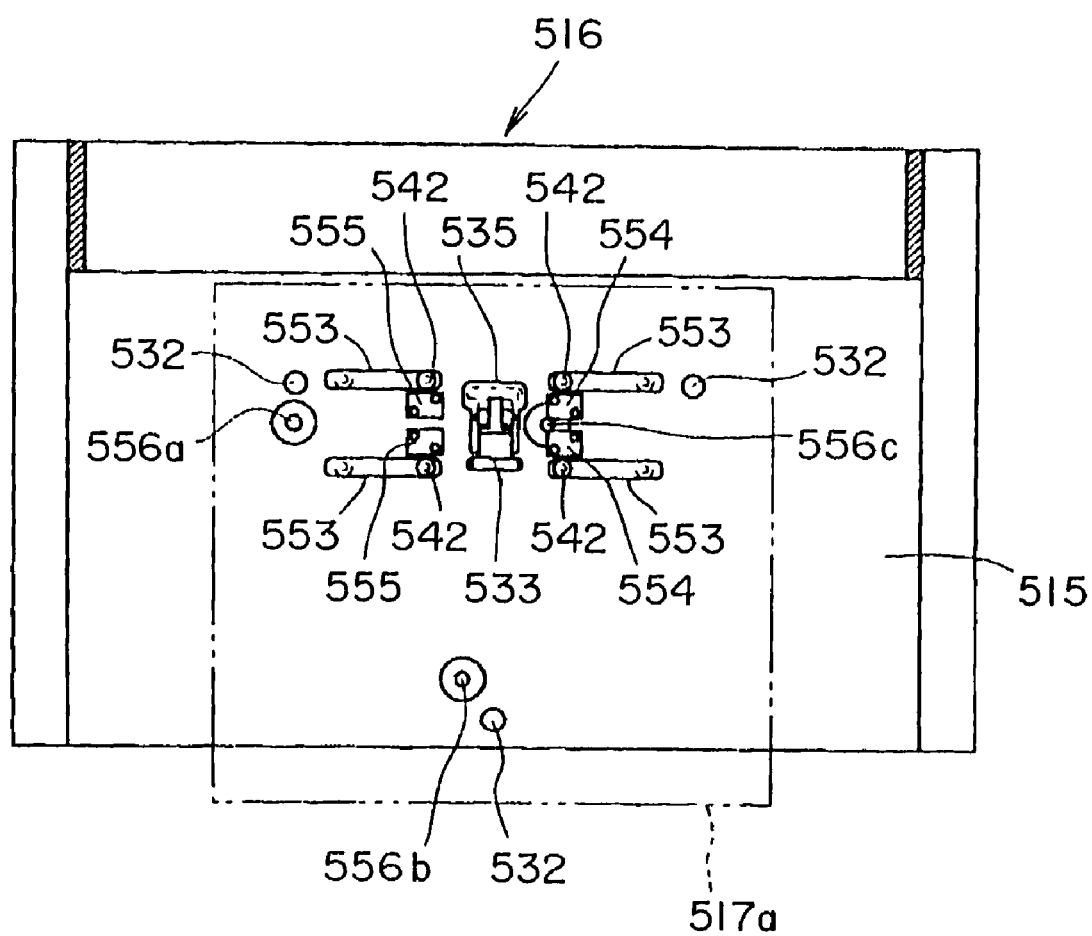
FIG. 16 is a plan view of a buffer cassette table.
Figure 17:
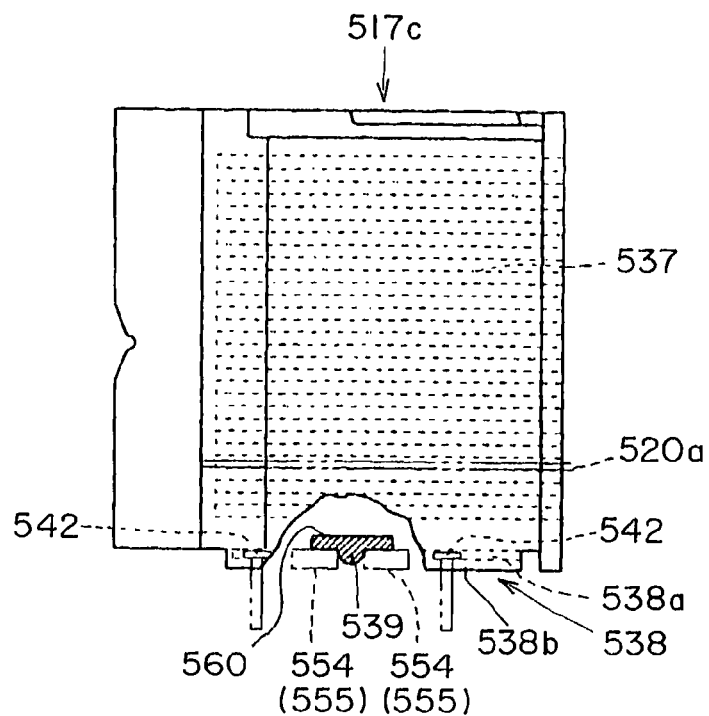
FIG. 17 is a right side partially sectional view of a buffer cassette only for 8-inch wafers.
Figure 18:
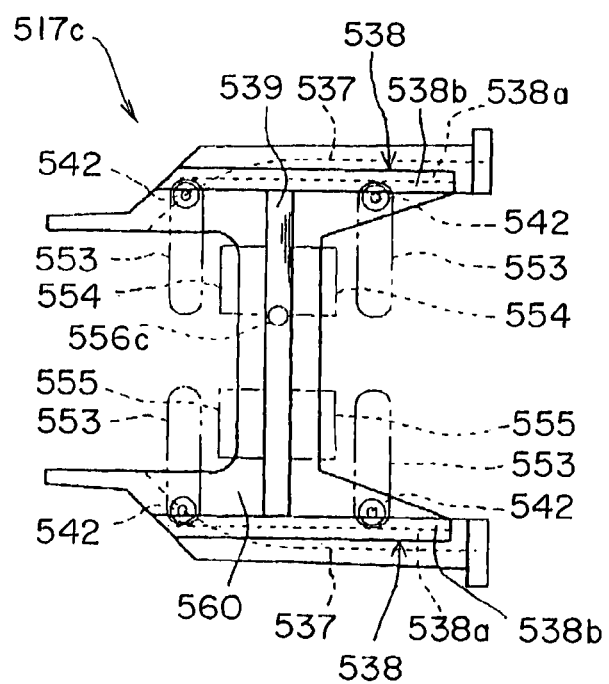
FIG. 18 is a bottom view of a buffer cassette only for 8-inch wafers.
Figure 19:
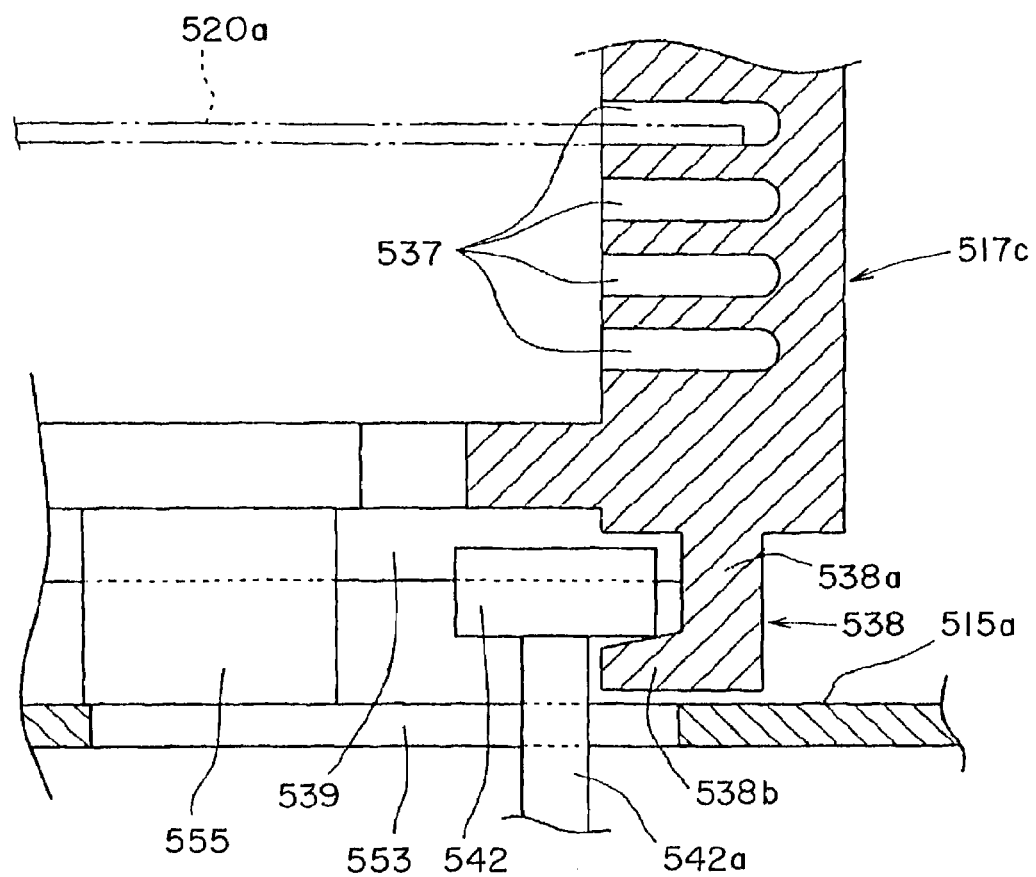
FIG. 19 is a front view showing an engaging portion of a buffer cassette only for 8-inch wafers.
Figure 20:
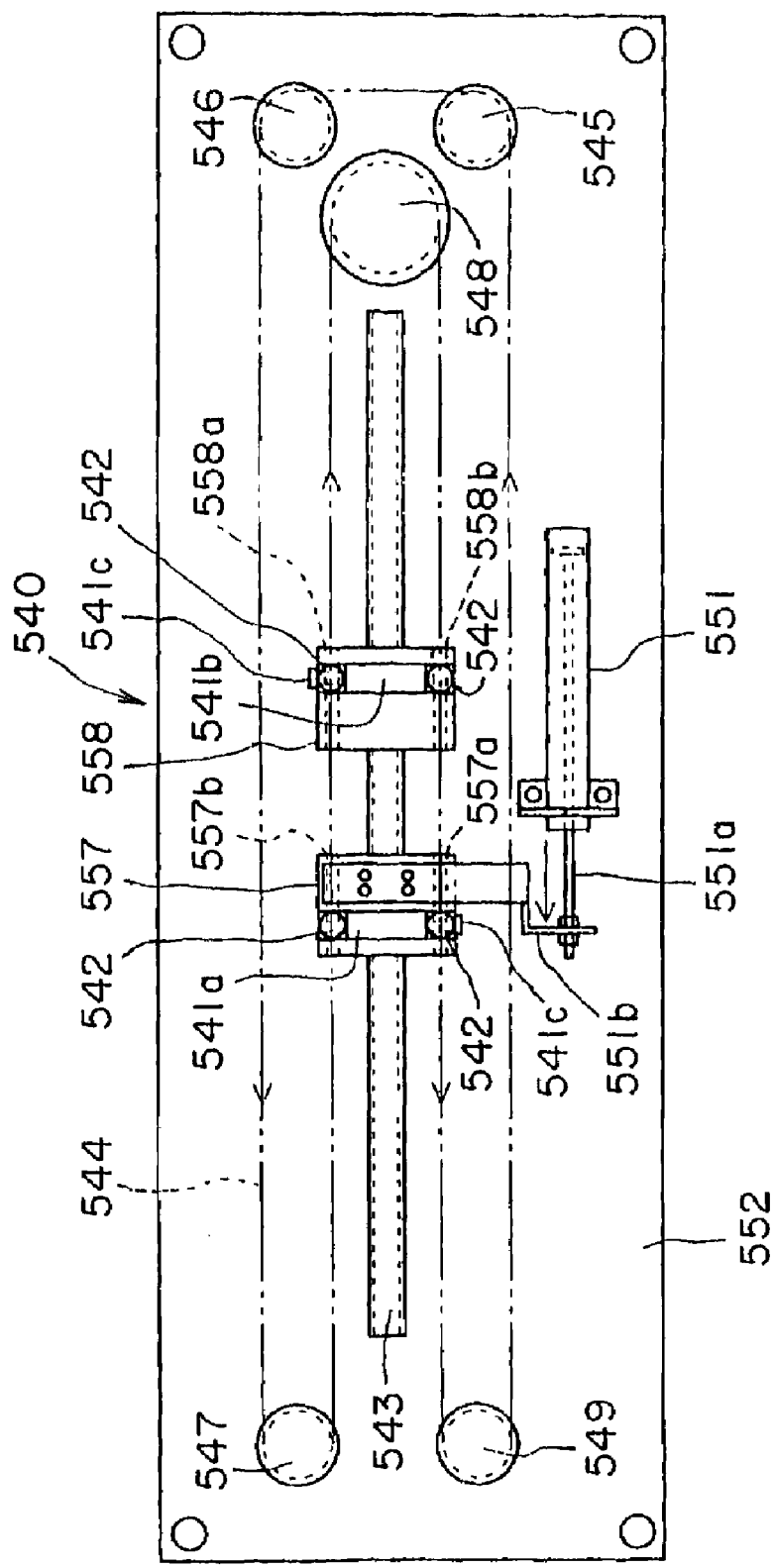
FIG. 20 is a plan view of a second holding mechanism.
Figure 21:
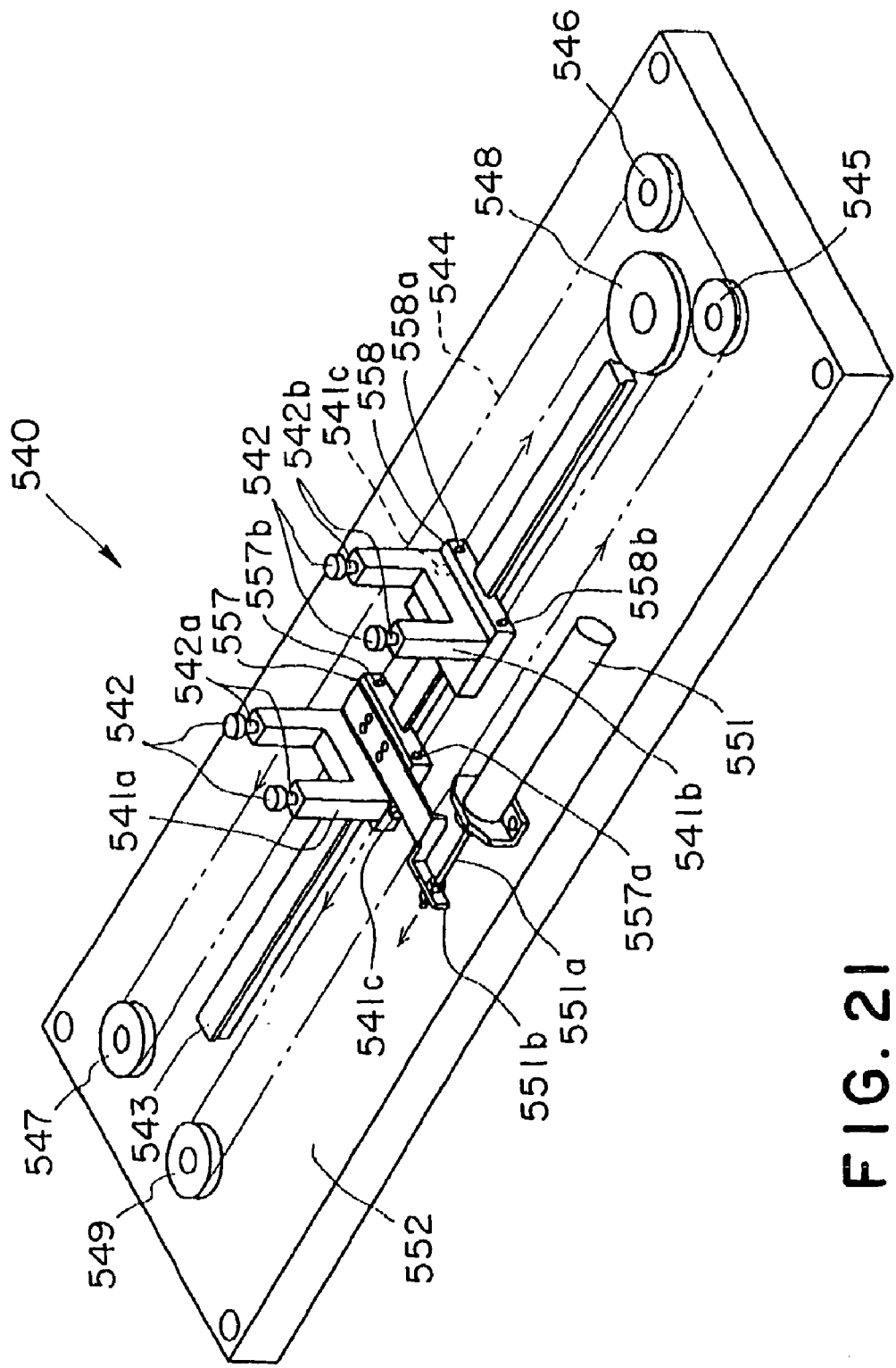
FIG. 21 is a perspective view of a second holding mechanism.

FIG. 11 is a schematic diagram showing a process operation part of a wafer processing operation, to which a preferred embodiment of an automatic guided vehicle according to the present invention is applied. FIG. 12 is a right side view of an automatic guided vehicle, and FIG. 13 is a plan view of an automatic guided vehicle. FIG. 14 is a side partially sectional view of a buffer cassette and a buffer cassette table, and FIG. 15 is a front partially sectional view of a buffer cassette and a buffer cassette table. FIG. 16 is a plan view of a buffer cassette table. FIG. 17 is a right side partially sectional view of a buffer cassette only for 8-inch wafers, and FIG. 18 is a view showing a mounting face of a buffer cassette only for 8-inch wafers. FIG. 19 is a front view showing an engaging portion of a buffer cassette only for 8-inch wafers. FIG. 20 is a plan view of a second holding mechanism, and FIG. 21 is a perspective view of a second holding mechanism.

First, referring to FIGS. 11 through 13, the whole construction of a preferred embodiment of an automatic guided vehicle system 501 according to the present invention will be described below.

As shown in FIG. 11, the automatic guided vehicle system 501 in this preferred embodiment is applied to a process operation part of a wafer processing operation. In this operation part, an automatic storage 503 for housing therein a wafer, and wafer processing units 504, 504, . . . , are arranged.

The automatic guided vehicle system 501 is equipped with an automatic guided vehicle 502 for transferring a wafer to a processing unit 504. The traveling path for the automatic guided vehicle 502 is formed along the automatic storage 503 and the processing units 504, 504, . . . .

In this preferred embodiment, traveling rails 507a and 507b are provided so as to extend along the traveling path of the automatic guided vehicle 502. The automatic guided vehicle 502 travels on the traveling rails 507a and 507b. On one traveling rail 507a, a feeding cable 508 for feeding power for moving the automatic guided vehicle 502 and for driving each operating part is provided. The automatic guided vehicle 502 has a core and a receiving coil wound onto the core, and utilizes electromagnetic induction from the feeding cable 508 to receive power in a non-contact form. A power supply unit 509 is provided on the side of the traveling path for the automatic guided vehicle 502 to feed power to the feeding cable 508.

In this preferred embodiment, the automatic guided vehicle 502 is a rail truck which travels on the traveling rails 507a and 507b, and receives power from the feeding cable from a non-contact form. The present invention should not be limited to this construction from the nature thereof. The automatic guided vehicle may receive power from a battery, and may be guided on the traveling path by a guidepath wire or a laser guided system without the need of any traveling rails.

In the process, a vehicle controller 510 for controlling the automatic guided vehicle 502 operated in the process is provided. In addition, a general control unit 506 for generally controlling the vehicle controller 510 provided in each process is provided.

The general control unit 506 is a host computer provided outside of the process, such as in a central control room, and transmits a transfer command to the automatic guided vehicle 502 via the vehicle controller 510.

The general control unit 506 and the vehicle controller 510 are connected to each other via a communication line. The vehicle controller 510 and the automatic guided vehicle 502 are connected to each other via a communication means 511a, which is connected to the vehicle controller 510, and a communication means 511b which is mounted on the automatic guided vehicle 502. For example, the communication means 511a and 511b comprise optical communication means.

Referring to FIGS. 12 and 13, the construction of the automatic guided vehicle 502 will be described below. On the vehicular body 505 of the automatic guided vehicle 502, an aligner 519, a single wafer transfer unit 518, and a buffer cassette are mounted. The vehicular body has traveling wheels 513, 513, . . . , and the automatic guided vehicle 502 can travel by means of a drive motor 514.

For convenience, with respect to the direction of the automatic guided vehicle 502, a direction in which an aligner, which will be described later, is mounted will be hereinafter referred to as "forward", and a direction in which a buffer cassette (a buffer cassette 517a for both of 12-inch and 8-inch wafers in FIG. 12) is mounted will be hereinafter referred to as "rearward".

In the buffer cassette, three kinds of cassettes (a buffer cassette 517a for both of 12-inch and 8-inch wafers, a buffer cassette only for 12-inch wafer, and a buffer cassette 517c only for 8-inch wafer) having different shapes of mounting faces (bottoms in this preferred embodiment) on the vehicular body 505 exist. In FIGS. 12 and 13, the buffer cassette 517a for both of 12-inch and 8-inch wafers is fixed.

As shown in FIG. 12, the automatic guided vehicle 502 is a rail truck traveling on the traveling rails 507a and 507b which are provided in a clean room, and utilizes electromagnetic induction to receive power in a non-contact form from the feeding cable 508 (shown in FIG. 11) provided one traveling rail 507a. Power is fed to power loads, such as a drive motor and a control apparatus, which are provided in the automatic guided vehicle 502.

In a rear portion on the top face of the vehicular body 505, a buffer cassette table 515 is provided. On the buffer cassette table 515, a first holding mechanism 536 and a second holding mechanism 540 are provided. The buffer cassette 517a has an opening for housing therein a wafer, and is mounted on the buffer cassette table 515 so that the opening 526 faces forwards (on the side of the single wafer transfer unit 518).

The buffer cassette can be fixed to and released from the buffer cassette table 515 by means of any one of the first holding mechanism 536 and second holding mechanism 540 in accordance with the kind thereof. That is, the buffer cassette is detachably mounted on the vehicular body 505.

The constructions of various buffer cassettes and holding mechanisms 536 and 540 will be described later.

In front of the buffer cassette table 515, the single wafer transfer unit 518 is provided, and in front thereof, an aligner (attitude control unit) 519 is provided.

The aligner 519 will be described below.

The wafers 520, 520, . . . housed in the buffer cassette are taken out, one by one, by means of the single wafer transfer unit 518. Then, after the aligner 519 corrects the absorbing position of the single wafer transfer unit 518 so that the crystal orientation of the wafer 520 faces in a predetermined direction, the wafer 520 is transferred to the processing unit 504, such as a producing unit or an inspecting unit, or the wafer 520 processed by the processing unit 504 is collected into the buffer cassette. This aligner 519 is provided with a swiveling supporting table for absorbing and holding the wafer 520, and a periphery detecting sensor for detecting the swiveling locus of the outer edge of the wafer 520 mounted on the supporting table. The aligner 519 detects a displacement of the mounting position of the wafer 520 from the center of the supporting table, on the basis of a difference between a locus detected by the periphery detecting sensor and a previously stored locus, and detects the position of a cut-out, such as a notch or orientation flat, which is formed in the outer edge of the wafer 520. The periphery detecting sensor is provided at both of a position, at which the locus of a 8-inch wafer 520a can be detected, and a position, at which the locus of a 12-inch wafer 520b can be detected. The aligner 519 is also provided with an ID reader (not shown) for reading production history information, such as a bar code, which is described on the surface of each wafer 520.

While the automatic guided vehicle 502 has been provided with the aligner 519 in this preferred embodiment, the present invention may be applied to an automatic guided vehicle having no aligner.

The single wafer transfer unit 518 will be described below.

The base of the single wafer transfer unit 518 is a lift mechanism 521. The lift mechanism 521 is provided on the automatic guided vehicle 502 so as to be movable in vertical directions. On the top end of the lift mechanism 521, a swivel table 522 capable of swiveling is provided. On the top face of the swivel table 522, two transfer arms, i.e., an upper arm 523 and a lower arm 524, are provided. By providing the two transfer arms, the transfer operation of the wafers 520, 520, . . . can be rapidly carried out.

Since the upper arm 523 and the lower arm 524 have the same construction, the upper arm 523 will be described below.

The upper arm 523 is a so-called scalar type transfer system which is horizontally articulated, and has a pair of tweezers 523a at the tip portion thereof. In the top face near the tip of the tweezers 523a, absorbing ports 525 and 525 are formed. The absorbing ports 525 and 525 are connected to a negative pressure producing mechanism (not shown), which is mounted on the automatic guided vehicle 502 and which comprises an air tank and an ejector, via an air pipe.

With this construction, the surface of the wafer 520 taken by the tweezers 523a is absorbed onto the tweezers 523a due to air suction by the absorbing ports 525 and 525, so that the wafer 520 does not fall during transfer. If the tweezers 523a are formed as a thin plate, the tweezers 523a do not contact other upper and lower wafers arranged in the buffer cassette during entering the buffer cassette.

The tweezers 524a of the lower arm 524 are always operated at a lower position than the tweezers 523a of the upper arm 523, so that the upper arm 523 and the lower arm 524 can carry out transfer operation without contacting each other.

The automatic guided vehicle 502 can load buffer cassettes housing therein different kinds and combinations of wafers.

In this preferred embodiment, the automatic guided vehicle 502 can load three kinds of different buffer cassettes. Specifically, the automatic guided vehicle 502 can load the buffer cassette 517a for both of 12-inch and 8-inch wafers, the buffer cassette 517b only for 12-inch wafers, and the buffer cassette 517c only for 8-inch wafers.

The buffer cassette 517b only for 12-inch wafers is a buffer cassette capable of housing therein the 12-inch wafer 520a. The buffer cassette 517c only for 8-inch wafers is a buffer cassette capable of housing therein the 8-inch wafer 520b. On the other hand, the buffer cassette 517a for both of 12-inch and 8-inch wafers is a buffer cassette capable of simultaneously housing therein the 8-inch wafer 520a and 12-inch wafer 520b which have different sizes.

That is, the automatic guided vehicle 502 can load the buffer cassette capable of simultaneously housing therein a plurality of wafers having different sizes. The buffer cassette 517a for both of 12-inch and 8-inch wafers is a buffer cassette capable of housing 8-inch wafers on upper shelves and 12-inch wafers on lower shelves so as to separate wafers of different sizes, although the details thereof will be described later. The buffer cassette housing therein a plurality of kinds of wafers should not be limited to the buffer cassette housing therein 8-inch and 12-inch wafers. For example, a buffer cassette for both of 6-inch and 8-inch wafers may be produced to be loaded.

As shown in FIGS. 14 and 15, the buffer cassette 517a for both of 12-inch and 8-inch wafers comprises a housing body 527, an 8-inch wafer housing portion 528, a 12-inch wafer housing portion 529, positioning legs 530, 530 and 530, and an engaging body 531, and can house therein both of wafers 520a having a diameter of 8 inches and wafers 520b having a diameter of 12 inches.

Even if the wafers 520a having a diameter of 8 inches and the wafers 520b having a diameter of 12 inches are mixed on the same processing line, it is not required to prepare and load a plurality of buffer cassette for handling wafers having different sizes on the automatic guided vehicle 502, or it is required to cause different automatic guided vehicles 502 to simultaneously travel.

The construction of the 12-inch wafer housing portion 529 will be described below.

In the 12-inch wafer housing portion 529, the wafers 520b are housed in a large number of states in vertical directions. On the right and left inner walls of the 12-inch wafer housing portion 529, a large number of 12-inch wafer supporting shelves 529a and 529a, a pair of right and left shelves of which support thereon the wafer 520b, are fixed in a large number stages in vertical directions. The pair of right and left 12-inch wafer supporting shelves 529a and 529a support thereon the edge portions of the wafer 520b having a diameter of 12 inches, so that a plurality of wafers 520b can be housed in the 12-inch wafer housing portion without contacting each other.

The 8-inch wafer housing portion 528 has the same construction as that of the 12-inch wafer housing portion. On the right and left inner walls of the 8-inch wafer housing portion 528, a large number of 8-inch wafer supporting shelves 528a and 528a, a pair of right and left shelves of which support thereon the wafer 520a, are fixed in a large number of states in vertical directions.

The distance between the right and left shelves 528a and 528a for 8-inch wafers is smaller than the distance between the right and left shelves 529a and 529 for 12-inch wafers in accordance with the size of the wafers.

While the construction of the interior of the buffer cassette 517a for both of 12-inch and 8-inch wafers have been formed so as to house the 8-inch wafers 520a in the upper half and the 12-inch wafers 520b in the lower half in this preferred embodiment, the 12-inch wafers 520b may be housed in the upper half, or the ratio of the number of the 8-inch wafers 520a capable of being housed to the number of the 12-inch wafers 520b capable of being housed (the ratio of the number of the 8-inch wafer supporting shelves 528 to the number of the 12-inch wafer supporting shelves 529) may be changed. Alternatively, shelves capable of handling wafers having a size of 6 inches may be newly formed so that three kinds of wafers having different diameters can be simultaneously housed.

The positioning means between the buffer cassette table 515 and the buffer cassette 517a for both of 12-inch and 8-inch wafers will be described below.

On the buffer cassette table 515, positioning pins 532, 532 and 532 are provided at three point, which correspond to the vertexes of an equilateral triangle, so as to vertically extend.

On the other hand, on the bottom face of the buffer cassette 517a for both of 12-inch and 8-inch wafers, positioning legs 530, 530 and 530 are provided. In the lower portion of each of the positioning legs 530, a positioning hole 530a is formed so as to engage a corresponding one of the positioning pins 532. Therefore, if the buffer cassette 517a is mounted on the buffer cassette table 515, the positioning pins 532 engage the corresponding positioning holes 531a to position the buffer cassette to regulate the movement thereof in horizontal directions.

However, there is the possibility that the buffer cassette may be shifted by large oscillation in vertical directions if only the engagement of the positioning pins 532 is provided. While the positioning holes 530a have been formed as the means for positioning the buffer cassette 517a in this preferred embodiment, positioning grooves based on the SEMI standard may be formed.

Therefore, the buffer cassette table 515 in this preferred embodiment is provided with a first holding mechanism 536 as a means for inhibiting the vertical movement of the buffer cassette 517a with respect to the buffer cassette table 515.

The first holding mechanism 536 comprises a positioning pin 532, a fixing hook 533, an air cylinder 534 and an opening portion 535.

On the mounting face of the housing body 527 of the buffer cassette 517a on the buffer cassette table 515, an engaging body 531 having an L shape viewed from the side protrudes. The L-shaped engaging body 531 comprises a base 531a and an engaging portion 531b. One end of the base 531a is fixed to the mounting face, and the face portion of the engaging portion 531b is parallel to the mounting face.

On the other hand, the fixing hook 533 is rotatably provided on the buffer cassette 515, and the air cylinder 534 is provided as a means for driving the fixing hook 533. The fixing hook 533 comprises a hook portion 533a having a key shape viewed from the side, and a sliding portion 533b having a long groove therein. In the central portion between the hook portion 533a and the sliding portion 533b, the fixing hook 533 is pivotably provided on a pivot mounted on the buffer cassette table 515.

To the tip of the retractable rod 534a of the air cylinder 534, an engaging shaft 534b parallel to the pivot of the fixing hook 533 is fixed. The long groove 533c formed in the sliding portion 533b has a width so that the engaging shaft 534b is movable in directions of the groove.

By the extension and retraction of the retractable rod 534a, the engaging shaft 534b moves forwards and rearwards (in extending and retracting directions of the retractable rod 534a). In accordance therewith, the sliding portion 533b rotates about the pivot 557 to rotate the hook portion 533a. Therefore, if the retractable rod 534a is extended, the hook portion 533a rotates counterclockwise in FIG. 14, and the tip of the hook portion 533a pressingly contacts the engaging body 531 to fix the engaging body 531. As a result, the buffer cassette 517a is fixed.

The top face of the buffer cassette 515 has the opening portion 535, so that the fixing hook 533 does not contact the top face of the buffer cassette 515 even if the fixing hook 533 rotates.

The fixing hook 533 is housed in the buffer cassette table 515 when it is not used.

The buffer cassette 517b (not shown) only for 12-inch wafers is used when handling only the 12-inch wafer 520b, and substantially has the same construction as that the interior of the buffer cassette 517a for both of 12-inch and 8-inch wafers is formed by the 12-inch wafer housing portion 529.

The shape of the bottom face being the mounting portion of the buffer cassette 517a for both of 12-inch and 8-inch wafers substantially has the same with respect to the positioning and mounting constructions (however, the shape of a portion detected by detecting means 556a, 556b and 556c, which will be described later, is different from that of the buffer cassette 517a).

That is, the cassette 517 only for 12-inch wafers can be fixed to or detached from the buffer cassette table 515 by means of the first holding mechanism 536.

The use of the buffer cassette 517c only for 8-inch wafer, which houses therein only wafers 520a having a diameter of 8 inches, will be described below.

As shown in FIGS. 17 and 18, the internal construction of the buffer cassette 517c only for 8-inch wafers is the same as that of the 8-inch wafer housing portion 528. On the right and left inner side walls of the buffer cassette 517c only for 8-inch wafers, a large number of 8-inch wafer supporting shelves 537 and 537, a pair of right and left shelves of which support thereon the wafer 520a, are fixed in a large number stages in vertical directions. The pair of right and left 8-inch wafer supporting shelves 537 and 537 support thereon the right and left edge portions of the wafer 520a, so that a plurality of wafers 520a can be housed therein without contacting each other.

The positioning structure for front and rear positions between the buffer cassette 517c only for 8-inch wafers and the buffer cassette table 515 will be described below.

To the center of the bottom face 560 of the buffer cassette 517c only for 8-inch wafers, a positioning bar 539 having a semi-circular cross section viewed from the side is fixed. The positioning bar 539 protrudes in right and left directions of the buffer cassette 517c only for 8-inch wafers.

On the other hand, a pair of positioning blocks 554 and 554 are fixed to the top face of the buffer cassette table 515 so as to be spaced from each other in forward and rearward directions. The distance between the pair of positioning blocks 554 and 554 is equal to the outside diameter of the positioning bar 539. If the positioning bar 539 is positioned between the pair of positioning blocks 554 and 554 to cause the buffer cassette 517c only for 8-inch wafers to be mounted on the buffer cassette table 515, the buffer cassette 517c only for 8-inch wafers is positioned at the front and rear positions with respect to the buffer cassette table 515. In this state, the opening portion of the buffer cassette 517c only for 8-inch wafers for housing the wafers faces forwards.

The positioning structure for right and left positions between the buffer cassette 517c only for 8-inch wafers and the buffer cassette table 515 will be described below.

On the bottom face 560 of the buffer cassette 517c only for 8-inch wafers (the mounting face on the buffer cassette table 515), a pair of right and left engaging portions 538 and 538 are formed on both of right and left end portions thereof.

As shown in FIG. 19, the engaging portion 538 is formed with vertical portions 538a, which protrude downwards (during loading) from the lower end portions of the right and left side walls of the buffer cassette 517c only for 8-inch wafers, and horizontal portions 538a which protrude toward both sides (during loading) from the tips of the vertical portions 538a in parallel to the bottom face 560. The horizontal portions 538b and 538b protrude (inwardly) from the vertical portions 538a and 538a so as to face each other. The bottom face 560, the horizontal portion 53b and the vertical portion 538 form the substantially U-shaped engaging portion 538.

On the other hand, a second holding mechanism 540 shown in FIG. 20 is provided in the buffer cassette table 515. The buffer cassette table 515 will be described below. The buffer cassette table 515 comprises housing bodies which have a different size as shown in FIG. 15 and which have ceiling plates 515a and 515b, respectively. The ceiling plate (which will be hereinafter referred to as an "upper ceiling plate") 515a of the upper housing body has long holes 553, 553, 553 and 553 through which shafts 542a and 542b, which will be described later, pass in vertical directions and in which the shafts 542a and 542b are movable in lateral directions.

The second holding mechanism 540 will be described below. As shown in FIGS. 15, 20 and 21, on the base member 552 supported on the ceiling plate (which will be hereinafter referred to as a "lower ceiling plate") 515b of the lower housing body of the buffer cassette table 515, a pair of sliders 557 and 558 slidable on a guide 543 are provided on the right and left sides. On the respective sliders 557 and 558, recessed chuck bases 541a and 541b having a horizontally extending member on the bottom thereof viewed from the side are mounted. Therefore, the respective chuck bases 541a and 541b are slidable on the guide 543 via the sliders 557 and 558. On the respective tips of the top portions of the chucks 541a and 541b, shafts 542a, 542a, 542b and 542b movable along and in the long holes 553, 553, 553 and 553 formed in the top ceiling plate 515a are provided. On these shafts 542a, 542a, 542b and 542b, engaging bodies 542, 542, 542 and 542 are mounted. Moreover, the second holding mechanism 540 has a driving mechanism for driving the chuck bases 541a and 541b.

As shown in FIG. 20, the driving mechanism is provided with an endless wire 544, and pulleys 545, 546, 547, 548 and 549 onto which the wire 544 is wound. Each of the sliders 557 and 558 is provided with a wire holder 541c for engaging the wire 544, and an air cylinder 551 for driving the slider 557, and is provided on the base member 552.

The pulleys 545, 546, 547, 548 and 549 are arranged so that the wire 544 forms a recess on the plane. At the center of the U-shape inside of the wire 544, the guide 543 is arranged. The sliders 557 and 558 have a pair of through holes 557a and 557b and a pair of through holes 558a and 558b, through which the wire 544 can pass, so that the through holes are parallel to the guide 543, respectively. A pair of portions of the wire 544 forming the inner U shape (specifically, portions extending between the pulleys 547 and 548 and between the pulleys 548 and 549) pass through the through holes. If the wire holder 541c engages the wire 544 passing through one of the pair of through holes, the sliders 557 and 558 are fixed to the wire 544. With respect to the engaging and fixing positions of the sliders 557 and 558 to the wire 544 at that time, one of the pair of portions of the wire 544 forming the U shape is fixed to the slider 557, and the other is fixed to the slider 558. Specifically, the slider 557 engages the wire 544 between the pulleys 548 and 549, and the slider 558 engages the wire 544 between the pulleys 547 and 548. On the top of the cylinder rod 551a of the air cylinder 551, the slider fixing member 551 is mounted. The slider fixing member 551b is fixed to the slider 557. With such a construction, if the air cylinder 551 is operated, the slider 557 moves, so that portions of the U-shaped wire 544 facing each other move in the opposite directions. That is, in accordance with the extension and retraction of the air cylinder 551, the slider 557 (the chuck base 541) and the slider 558 (the chuck base 541b) approach and leave each other.

The engaging bodies 542 arranged above the chuck bases 541a and 541b have a height so as to be capable of entering the engaging portions 538. If the engaging bodies 542 move outwardly from the center (move in a direction in which the chuck base 541a leaves the chuck base 541b), the engaging bodies 542 engage the engaging portions 538, so that the buffer cassette 517c is fixed to the buffer cassette table 515. If the engaging bodies 542 move toward the center from a state that the engaging bodies 542 engage the engaging portions 538 (move in a direction in which the chuck base 541a approaches the chuck base 541b), the engaging bodies 542 disengage from the engaging portions 538, so that the buffer cassette 517c is detachable from the buffer cassette table 515.

As shown in FIGS. 17 and 18, when the buffer cassette 517c only for 8-inch wafers is fixed to the buffer cassette table 515, the buffer cassette 517c is mounted so that the positioning bar 539 is fitted into a space between the two sets of pairs of positioning blocks 554 and 555 protruding from the top face of the buffer cassette table 515. Thus, the positioning is carried out at the front and rear positions.

Subsequently, the second holding mechanism 540 is operated to move the two sets of pairs of positioning bodies 542, 542, 542 and 542 outwardly in right and left directions of the automatic guided vehicle 502, so that the engaging portion 538 provided on the cassette 517 only for 8-inch wafers engages the engaging body 542.

Thus, the buffer cassette 517*c* only for 8-inch wafers is positioned and fixed to the buffer cassette table 515. Furthermore, in this preferred embodiment, the horizontal portion 538*b* of the engaging portion 538 of the buffer cassette 517*c* is provided so as to face the inside of the buffer cassette 517*c*, and in accordance therewith, the engaging body 542 moves outwardly from the inside (the central axis) to cause the buffer cassette 517*c* to engage the buffer cassette 515. However, if the horizontal portion 538*b* of the buffer cassette 517*c* faces outside, the engaging body 542 may be moved to inside from outside to engage.

The first holding mechanism 536 for fixing the buffer cassette 517*a* for both of 12-inch and 8-inch wafers or the buffer cassette 517*b* only for 12-inch wafers to the buffer cassette table 515, and the second holding mechanism 540 for fixing the buffer cassette 517*c* only for 8-inch wafers to the buffer cassette 515 are formed so as not to interfere with each other and obstruct each other when a thing other than a predetermined buffer cassette is mounted.

As described above, the buffer cassette mounted on the automatic guided vehicle 502 is detachably mounted on the automatic guided vehicle 502.

Thus, buffer cassettes housing therein wafers having different sizes can be mounted on the automatic guided vehicle 502. Therefore, if only the buffer cassette is replaced with another kind of buffer cassette, one automatic guided vehicle 502 can be used on a producing line for wafers having different sizes, so that parts can be commonly used.

The vehicular body 505 is provided with the control unit 512 of the single wafer transfer unit 518. The single wafer transfer unit 518 is controlled by a transfer operating program stored in the control unit 512. Although it is required to use a different transfer operating program in accordance with the kind of the wafer transferred by the single wafer transfer unit 518, various transfer operating programs are stored in the control unit 512.

The reasons why different transfer programs are required are that the transfer distances to the buffer cassette and aligner 519, which are mounted on the automatic guided vehicle 502, and the transfer distances to the processing units, which are provided along the traveling path, vary in accordance with the size of the wafer transferred by the single wafer transfer unit 518, so that it is required to vary the length of extension and retraction of the tweezers 523*a* and 523*b* of the single wafer transfer unit 518.

Therefore, if different transfer operating programs in accordance with the size of the wafer are stored in the control unit 512 of the single wafer transfer unit 518, the transfer operation of the single wafer transfer unit 518 can be changed in accordance with the size of the wafer transferred by the single wafer transfer unit 518. Therefore, when different kinds of buffer cassettes are mounted on the automatic guided vehicle 502 to transfer different kinds of wafers, the transfer operation of the single wafer transfer unit 518 can be changed, so that the automatic guided vehicle 502 can be immediately used on production lines for different sizes of wafers.

The above described buffer cassette 517*a* for both of 12-inch and 8-inch wafers, which is one of various kinds of buffer cassettes is provided with the 8-inch wafer housing portion 528 and the 12-inch wafer housing portion 529. The 8-inch wafer housing portion 528 is provided with the 8-inch wafer supporting shelves 528*a* and 528*a* for housing the 8-inch wafers 520*b*, and the 12-inch wafer housing portion 529 is provided with the 12-inch wafer supporting shelves 529*a* and 529*a* for housing the 12-inch wafers 520*a*.

In the automatic guided vehicle 502 in this preferred embodiment, both of the 12-inch wafer transfer program and the 8-inch wafer transfer program are operated in the buffer cassette 517*a* for both of 12-inch and 8-inch wafers to control the single wafer transfer unit 518 so as to be capable of coping even if the processing unit for 8-inch wafers 520*a* and the processing unit for 12-inch wafers 520*b* are mixed. That is, when the 8-inch wafer 520*a* is transferred to the 8-inch wafer supporting shelves 528*a* and 528*a*, the 8-inch wafer transfer operating program is selected from transfer operating programs stored in the control unit 512, and when the 12-inch wafer 520*b* is transferred to the 12-inch wafer supporting shelves 529*b* and 529*b*, the 12-inch wafer transfer operating program is selected. These transfer operating programs are applied when the wafer 520*a* (or the wafer 520*b*) is fed to the aligner 519 from the pair of shelves 528*a* and 528*a* (or the shelves 529*a* and 529*a*) housing the wafer, and when the wafer 520*a* (or the wafer 520*b*) is transferred to the processing unit 504, such as an inspecting unit or a producing unit. As methods for selecting the transfer operating program, there are a method for storing two kinds of programs of the 8-inch wafer transfer operating program and the 12-inch wafer transfer operating program in the control units 512 to select an applicable program in accordance with a wafer transfer command at the position of the shelves, and a method for further storing a transfer operating program for the buffer cassette 517*a* for both of 12-inch and 8-inch wafers, which includes both of the 8-inch wafer transfer operating program and the 12-inch wafer transfer operating program so as to work with a vertically moving command when the single wafer transfer unit 518 vertically moves to a position of the 8-inch wafer supporting shelves 528*a* and 528*a* and the 12-inch wafer supporting shelves 529*a* and 529*a*, to select it.

When the buffer cassette 517*c* only for 8-inch wafers and the buffer cassette 517*b* only for 12-inch wafers is mounted, the transfer operating program only for 8-inch wafers or 12-inch wafers is selected. Thus, in the automatic guided vehicle 502 in this preferred embodiment, buffer cassettes of different kinds can not only be mounted, but the optimum transfer operating program can be selected in accordance with the kind of the mounted buffer cassette, from the transfer operating programs of the single wafer transfer unit 518 stored in the control unit 512. Moreover, the mounted aligner 519 has periphery detecting sensors capable of detecting both of the 8-inch wafer 520*a* and the 12-inch wafer 520*b* to be mounted, so that an appropriate sensor is selected in accordance with the kind of the mounted buffer cassette. Thus, even if a conventional processing line only for 8-inch wafers 520*a* is changed, by layout change or the like, to a processing line including both of a processing unit for 8-inch wafers 520*a* and a processing unit for 12-inch wafers 520*b*, or to a processing line only for a processing unit for 12-inch wafers 520*b*, the same automatic guided vehicle 502 can be used only by changing the kind of a buffer cassette to be mounted, without changing the design of the single wafer transfer unit 518.

A method for detecting different kinds of buffer cassettes on the side of the automatic guided vehicle 502 will be described below.

The shape of the mounting face of the buffer cassette on the buffer cassette table 515 is formed so as to have a different portion every kind of the buffer cassette. Specifically, an outwardly protruding portion, such as the positioning leg 530, is formed on the bottom face (mounting face) of the buffer cassette, and the shape of the protruding portion is different every buffer cassette. Therefore, in the automatic guided vehicle 502 in this preferred embodiment, the kind of the buffer cassette mounted on the buffer cassette table 515 is recognized by detecting the presence of the protruding portion by means of a detecting mechanism.

This detecting mechanism comprises detecting means 556a, 556b and 556c which are arranged so that only the detecting portions thereof protrude upwardly from the upper ceiling 515a as shown in FIG. 16, and a control unit 512 to which detection signals of the detecting means 556a, 556b and 556c are transmitted. The control unit 512 also serves as the control unit for the single wafer transfer unit 518.

The respective detecting means 556a, 556b and 556c are designed to detect articles if the detecting portions are depressed, and are provided at three places on the top face of the buffer cassette 515. The detecting means 556a, 556b and 556c are push buttons which upwardly protrude from the top face of the buffer cassette table 515. For example, when the buffer cassette 517c only for 8-inch wafers is mounted on the buffer cassette table 515, the detecting means 556c is depressed by the positioning bar 539 which protrudes from the bottom face of the buffer cassette 517c only for 8-inch wafers. At this time, the remaining two detecting means 556a and 556b are designed so as not to be depressed by the buffer cassette 517c only for 8-inch wafers.

The detecting mechanism for detecting the difference in shape of the mounting face is designed to determine whether a detection signal is produced from any one of the detecting means 556a, 556b and 556c by means of a determination circuit, which is provided in the control unit 512, to recognize the difference in shape of the mounting face (bottom face) of the buffer cassette. By the results of this recognition, the detecting mechanism detects the difference in kind of the buffer cassette.

For example, if no detection signal is produced from the detecting means 556a and 556b while only the detecting means 556c is depressed to produce a detection signal, it is detected by the detecting mechanism that the buffer cassette mounted on the automatic guided vehicle 505 is the buffer cassette 517 only for 8-inch wafers.

In the buffer cassette 517c only for 8-inch wafers, the positioning bar 539 is the protruding portion which protrudes from the bottom face (mounting face), and is a detecting portion, by which a difference from other cassettes is detected by the vehicular body 505.

The buffer cassette 517a for both of 12-inch and 8-inch wafers and the buffer cassette 517b only for 12-inch wafers are substantially the same. In the case of the buffer cassette 517a for both of 12-inch and 8-inch wafers, only the detecting means 556a of the three detecting mechanisms is depressed by the protruding portion (not shown) provided on the bottom face (mounting face) of the buffer cassette 517a. This protruding portion is a detecting portion, by which a difference from other buffer cassettes is detected by the vehicular body 505.

In the case of the buffer cassette 517b only for 12-inch wafers, only the detecting means 556b of the three detecting means is depressed by the protruding portion (not shown) provided on the bottom face (mounting face) of the buffer cassette 517b only for 12-inch wafers. Also in this case, this protruding portion is a detecting portion, by which a difference from other buffer cassettes is detected by the vehicular body 505.

With this construction, the kind of the buffer cassette mounted on the buffer cassette table 515 of the automatic guided vehicle 502 can be detected by the detecting mechanism in accordance with the depression of any one of the detecting means 556a, 556b and 556c.

In this preferred embodiment, only one of the detecting means 556a, 556b and 556c is depressed, and the results of the detection are detected by the control means 512. However, a plurality of detecting means 556a, 556b and 556c may be simultaneously depressed, or the detecting means 556a, 556b and 556c may be suitably combined to be depressed, so that the combination thereof may be detected to determine the kind of the buffer cassette by the control means 512. While the kind of the buffer cassette is detected by the shape of the bottom face in this preferred embodiment, the kind of the buffer cassette may be detected by image recognition using an image pick-up means, such as a CCD camera. While the size of the wafer housed in the buffer cassette has been recognized by detecting the kind of the buffer cassette, the size of the wafer may be directly recognized by means of a CCD camera or a laser sensor.

Therefore, the positions of the detecting means 556a, 556b and 556c in this preferred embodiment may be changed so that both of the detecting means 556a and 556b are depressed by the protruding portion on the bottom face of the buffer cassette 517a for both of 12-inch and 8-inch wafers in the case of the buffer cassette 517a for both of 12-inch and 8-inch wafers.

The automatic guided vehicle 502 has a control unit for operating a holding mechanism according to the buffer cassette mounted on the vehicular body 505, on the basis of the detected results of the detecting mechanism.

If the detecting mechanism detects that the buffer cassette to be mounted is any one of the buffer cassette 517a for both of 12-inch and 8-inch wafers and the buffer cassette 517b only for 12-inch wafers, the control unit operates the first holding mechanism 536. If the detecting mechanism detects that the buffer cassette to be mounted is the buffer cassette 517c only for 8-inch wafers, the control unit operates the second holding mechanism 540.

In this preferred embodiment, the control unit for operating the holding mechanism also serves as the control unit 512 of the single wafer transfer unit 518.

Therefore, the holding mechanism corresponding to the buffer cassette to be mounted can be operated by the difference in shape of the mounting face (bottom face) of the buffer cassette mounted on the vehicular body 505. In particular, it is not required to previously transmit data, which relates to the buffer cassette to be mounted, to the automatic guided vehicle 502 by the outside control units, such as the general control unit 506 and the vehicle controller 510, so that it is possible to reduce the amount of data transmitted to the automatic guided vehicle 502 from the outside unit.

In addition, even if the automatic guided vehicle 502 uses a plurality of kinds of buffer cassettes, it is not required to prepare data, which relates to the buffer cassettes, by the outside unit every time the buffer cassette is exchanged.

If the kind of the buffer cassette is detected by the detecting mechanism for detecting the difference in shape of the mounting face of the buffer cassette mounted on the buffer cassette table 515, the holding mechanism according to the buffer cassette is operated.

The control unit 512 of the single wafer transfer unit 518 changes the transfer operation mode of the single wafer transfer unit 518 to that corresponding to the kind of the detected buffer cassette, on the basis of the detected results of the detecting mechanism, i.e., on the basis of the detection of the kind of the buffer cassette.

As described above, the control unit 512 stores therein the transfer operating programs according to the size of the wafer.

At this time, the control unit 512 changes the transfer operation mode on the basis of the detected results of the detecting mechanism so that the single wafer transfer unit 518 is operated by the transfer operating program corresponding to the mounted buffer cassette. That is, the switching control of the transfer operating program for making active is carried out in the control unit 512.

Therefore, the automatic guided vehicle 502 can be caused to wait in an appropriate operation mode according to the mounted buffer cassette, without previously transmitting data, which relates to the mounted buffer cassette, to the automatic guided vehicle 502. Thus, since it is not required to include data, which relates to the mounted buffer cassette, when a transfer command is transmitted to the automatic guided vehicle 502 from the outside control units, such as the general control unit 506 and the vehicle controller 510, it is possible to reduce the capacity of the transfer command. Thus, it is possible to reduce the load of the outside control units, and the load of the communication apparatus for carrying out communication between the automatic guided vehicle 502 and the outside control units 2.

In this preferred embodiment, when the buffer cassette is exchanged, the transfer operation starts in accordance with the following procedure between the automatic guided vehicle 502, and the general control unit 506 and the vehicle controller 510 which are outside control units.

At the first stage, in the automatic guided vehicle 502, the operation for exchanging the buffer cassette may be carried out manually or automatically using another transfer system. For example, the transfer system for the buffer cassette is provided on the automatic storage 503 for exchanging the buffer cassette.

At the second stage, the kind of the cassette mounted at the first stage is detected by the detecting mechanism of the automatic guided vehicle 502. The control unit 512 provided on the detecting mechanism detects the kind of the buffer cassette on the basis of the mounting face (bottom face) of the buffer cassette.

At the third stage, the control unit 512 operates the holding mechanism according to the kind of the buffer cassette, on the basis of the detected results of the detecting mechanism to hold the buffer cassette on the vehicular body 505.

At the fourth stage, the control unit 512 selects a transfer operating program, which corresponds to the wafer housed in the mounted buffer cassette, from transfer operating programs, which are stored in the control unit 512, on the basis of the detected results of the detecting mechanism to change the transfer operation mode so that the single wafer transfer unit 518 operates on the basis of the selected transfer operating program.

In this preferred embodiment, in this state, the automatic guided vehicle is in a stand-by state for waiting for a transfer command of the general control unit 506 and vehicle controller 510 being output control units.

At the fifth stage, the control unit 512 transmits data, which relates to the kind of the buffer cassette mounted on the automatic guided vehicle 502 itself, to the vehicle controller 510 on the basis of the detected results.

At the sixth stage, if the transfer command to the automatic guided vehicle 502 is transmitted from the general control unit 506 to the vehicle controller 510, data relating to the size of the wafer included in the data is compared with data relating to the kind of the buffer cassette transmitted from the control unit 512 of the automatic guided vehicle 502.

Then, from the comparison in the vehicle controller 510, if the size of the wafer relating to the transfer command is the size of a wafer which can be housed in the buffer cassette mounted on the automatic guided vehicle 502, it is determined that there is no problem. If the size of the wafer relating to the transfer command is the size of a wafer which can not be housed in the buffer cassette mounted on the automatic guided vehicle 502, it is determined that there is an error.

At the seventh stage, if there is no problem in the compared results in the vehicle controller 510, a transfer command is transmitted to the automatic guided vehicle. At this time, since the verifying operation relating to the size of the wafer is completed, the transfer command produced from the general control unit 506 is reedited to prepare a transfer command having a smaller amount of data, from which undesired data, such as the size of the wafer, is removed. The reedited transfer command is transmitted to the general control unit 506 from the vehicle controller 510.

On the other hand, if the compared results in the vehicle controller are errors, data relating to errors is transmitted to the general control unit 506 from the vehicle controller 510. The transmission of the transfer command to the automatic guided vehicle 502 is temporarily interrupted. Then, it is possible to prevent deficiencies, such as damage of a wafer due to transfer operation, from being caused by mistaking the size of the wafer.

The third through fifth stages may be simultaneously carried out. While the transmit data of the general control unit 506 has been compared with the transmit data of the automatic guided vehicle 502 by means of the vehicle controller 510 in this preferred embodiment, the vehicle controller 510 may be omitted to directly transmit and receive data between the general control unit 506 and the automatic guided vehicle 502 to compare data by the general control unit 506 or control unit 512.

Moreover, the detecting means 556a, 556b and 556c should not be limited to the push buttons. For example, if three sets of transmission optical sensors are provided on the buffer cassette table 515 and if a member for interrupting only light of a specific transmission optical sensor may be provided on the mounting face (bottom face) of each of the three kinds of buffer cassettes, the same advantageous effects can be obtained. The kinds of the buffer cassette should not be limited to the three kinds in this preferred embodiment, and may be four kinds or more.

While two periphery detecting sensors for 8-inch and 12-inch wafers have been provided in parallel as the periphery detecting sensors provided on the aligner 519 in this preferred embodiment, the number of the periphery detecting sensors may be changed in accordance with the construction of the processing line while the sensors can be provided in parallel.

As described above, according to the second invention, in an automatic guided vehicle system comprising an automatic guided vehicle for mounting thereon a buffer cassette housing therein wafers and a single wafer transfer unit, for transferring the buffer cassette housing therein the wafers to a wafer processing unit and for transferring the wafers in the buffer cassette to the processing unit by means of the single wafer transfer unit, and a transfer operation control unit for the single wafer transfer unit, the control unit stores therein a transfer operating program for causing the single wafer transfer unit to carry out a transfer operation corresponding to the size of the wafers housed in the buffer cassette, so that it is possible to transfer the wafers of different sizes by means of the single wafer transfer unit. As a result, for example, even if an 8-inch wafer processing unit and a 12-inch wafer processing unit are provided on a processing line for processing wafers, a single automatic guided vehicle can cope therewith. Even if a processing line including only an 8-inch processing unit is changed, by the layout change, to a processing line including an 8-inch processing unit and a 12-inch processing unit provided in parallel, or even if a processing line includes only a 12-inch processing unit, it is possible to cope therewith.

Since the buffer cassette is provided with shelves for separately housing two kinds of wafers of different sizes every size, even if the 8-inch wafer processing unit and the 12-inch wafer processing unit are provided on the same producing line, a single automatic guided vehicle can cope therewith.

In particular, since it is not required to exchange the buffer cassette, which is mounted on the automatic guided vehicle, every time the size of the mounted wafers varies, the efficiency of the transfer operation is not decreased.

The automatic guided vehicle is provided with the table on which the buffer cassette is detachably mounted. On this table, the plurality of buffer cassette holding mechanisms corresponding to the buffer cassettes of different kinds for the size of the housed wafers, and the detecting mechanism for detecting the kind of the buffer cassette are provided. In addition, there is provided the control unit for operating the holding mechanism corresponding to the kind of the buffer cassette detected by the detecting mechanism. Therefore, since the buffer cassette can be easily exchanged, the buffer cassette can be easily exchanged to the optimum buffer cassette when the kind of the wafers to be processed is changed by the layout change. When the buffer cassette is exchanged, the difference in kind of the buffer cassette can be recognized by the detecting mechanism to operate the optimum holding mechanism.

The transfer operating program comprises a plurality of programs corresponding to the size of wafers, and the detecting mechanism is provided for detecting the size of the wafers housed in the buffer cassette. The transfer operation control unit has the mechanism for selecting the transfer operating program for the size of the corresponding wafer on the basis of the detected results from the detecting mechanism for detecting the size of the wafer, to change the transfer operation of the single transfer system to the optimum transfer mode. Therefore, the optimum transfer program for transferring the wafers can be selected from the stored transfer operating programs on the basis of the results recognized by the detecting mechanism, to set the optimum transfer mode. Therefore, it is possible to transfer wafers without transmitting data, which relates to the size of the wafers and which include transfer commands, to the automatic guided vehicle from outside control units, and it is possible to reduce data transmitted from outside control units to the automatic guided vehicle. In addition, it is possible to reduce the load on outside control units and the control unit of the automatic guided vehicle.

Since the detecting mechanism for detecting the size of wafers is the detecting mechanism for detecting the kind of the buffer cassette, the kind of wafers housed in the buffer cassette can be easily recognized by detecting the kind of the buffer cassette.

Referring to FIGS. 22 through 28, a preferred embodiment of an automatic guided vehicle according to the third invention will be described below.

Figure 22:
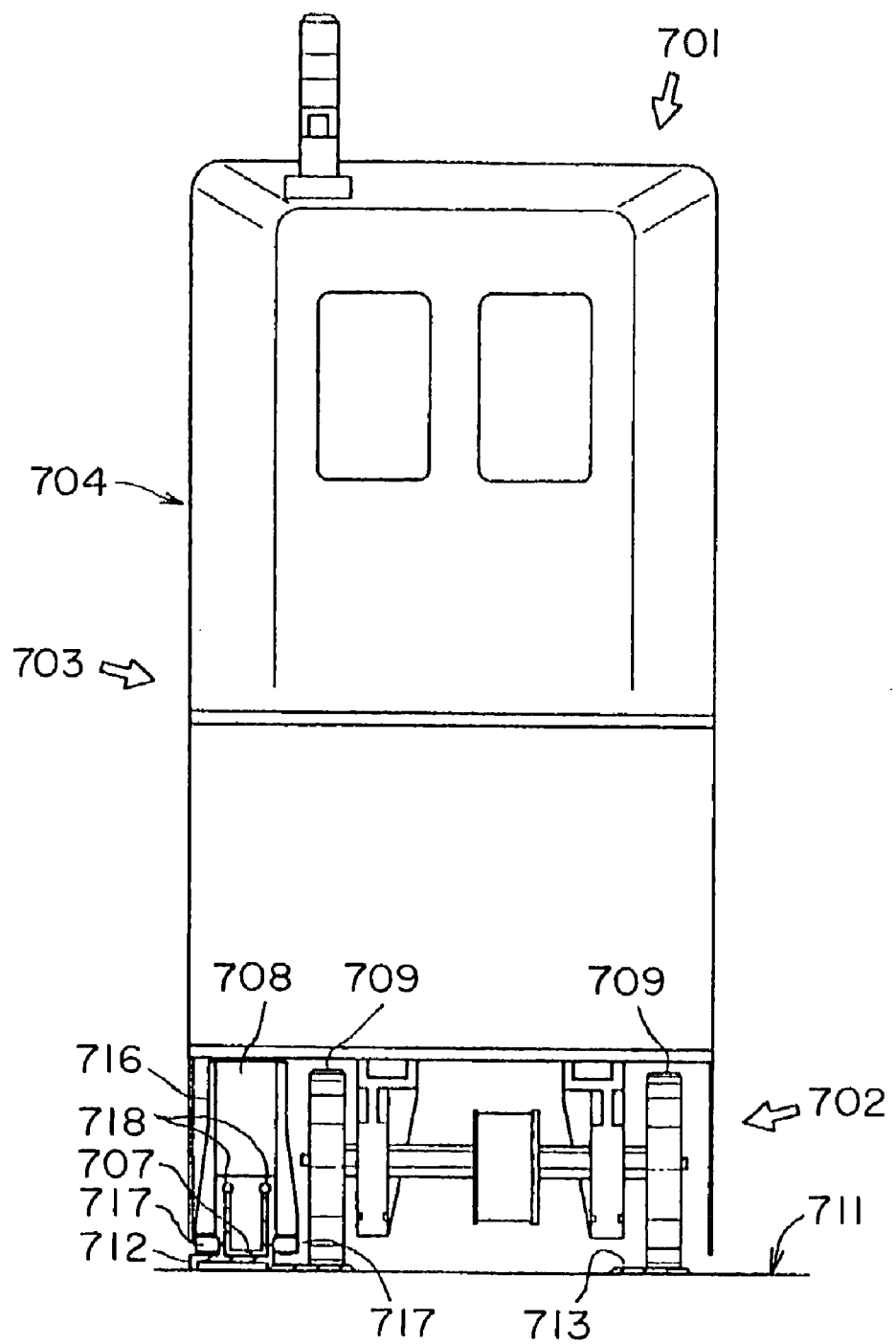
FIG. 22 is a front view showing a preferred embodiment of an automatic guided vehicle according to the third invention.
Figure 23:
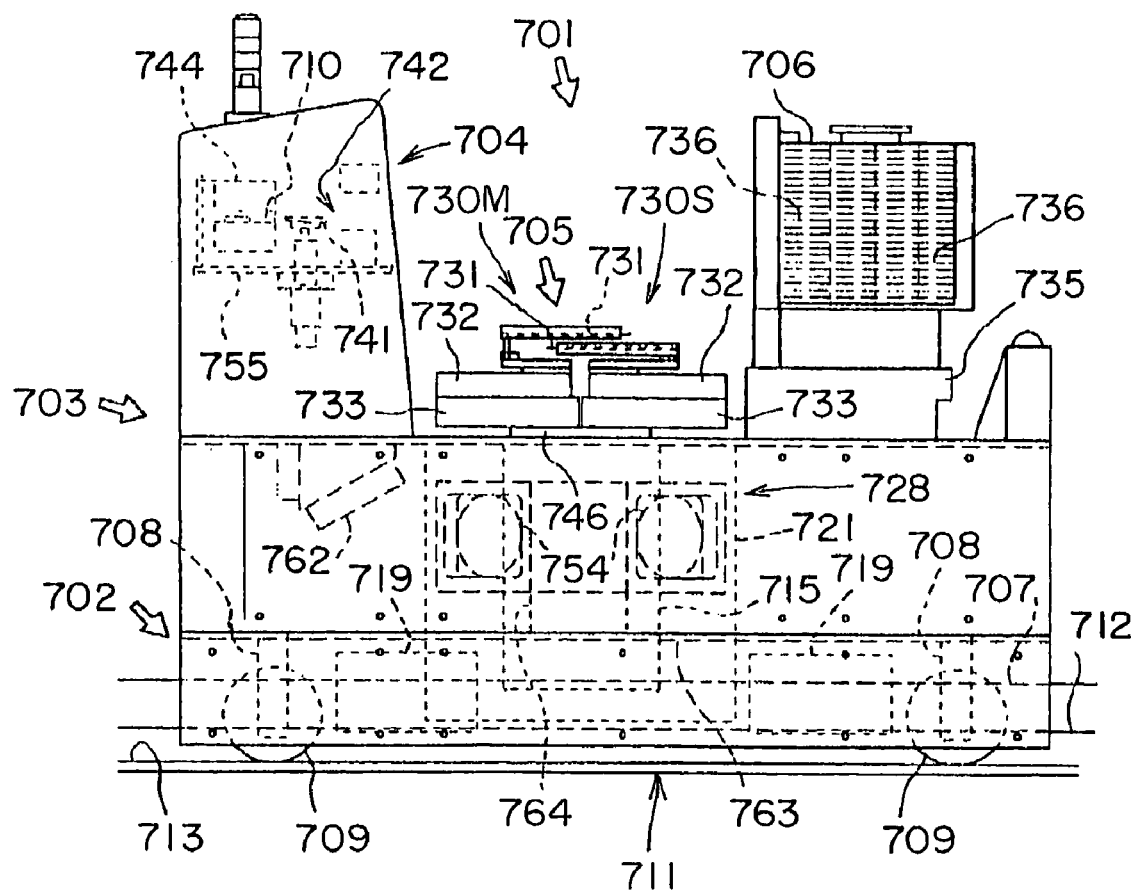
FIG. 23 is a side view of an automatic guided vehicle.
Figure 24:
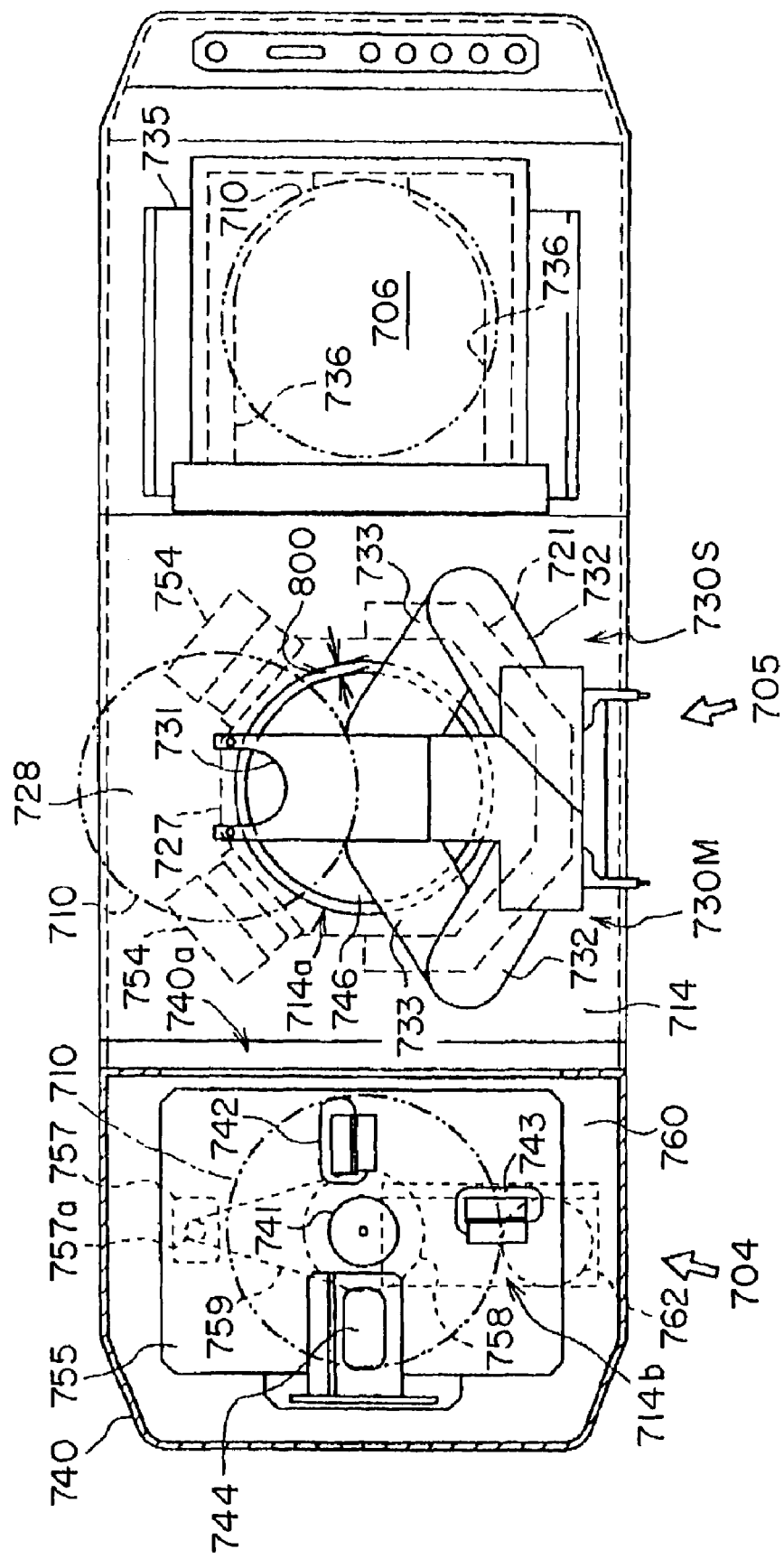
FIG. 24 is a plan view of an automatic guided vehicle.

Referring to FIGS. 22 through 24, a preferred embodiment of an automatic guided vehicle 701 according to the invention will be described below. FIG. 22 is a front view of a vehicle 701, FIG. 23 is a side view of the vehicle 701, and FIG. 24 is a plan view of the vehicle 701.

A traveling part 702 has traveling wheels 709, 709, . . . for supporting the automatic guided vehicle 701 (which will be hereinafter referred to as a vehicle 701) and allowing the traveling of the vehicle 701, on the right and left sides in the traveling direction of the vehicle 701. Two sets of pairs of traveling wheels 709 and 709 are provided fore and aft on the right and left sides of the vehicle 701, so that the vehicle 701 is provided with the four traveling wheels 709 as a whole.

The traveling wheels 709, 709, . . . are driven by the front and rear wheel drive, and are driven by dividing the driving force of the same drive motor (not shown). By the driving force of the drive motor, the traveling wheels 709, 709, . . . rotate, so that the vehicle 701 can travel.

In this preferred embodiment, the vehicle 701 is a rail truck traveling on traveling rails 712 and 713 provided so as to extend along the traveling path of the vehicle 701. The traveling rails 712 and 713 are provided on a floor face 711. The traveling rails 712 and 713 are provided with traveling faces 712*a* and 713*a* (shown in FIG. 28) contacting the traveling wheels 709 and 709, respectively.

Figure 28:
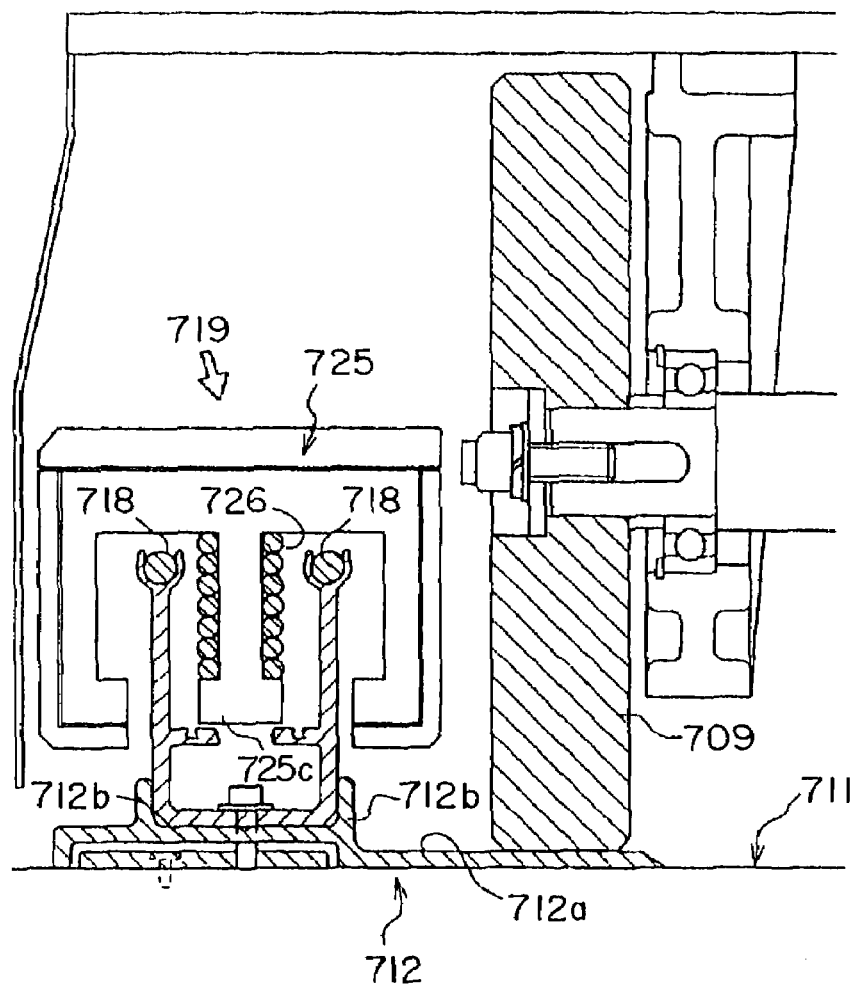
FIG. 28 is a front view of a principal part of an automatic guided vehicle, which shows the construction of a non-contact feeding.

Feeders 718 and 718 are provided so as to extend along the traveling line, and the vehicle 701 is provided with a receiving unit 719 having a core 725 (shown in FIG. 28). The vehicle 701 can utilize electromagnetic induction by the feeders 718 and 718 for taking power out in a non-contact form.

In this preferred embodiment, the vehicle 701 receives power from the feeders 718 and 718 provided along the traveling path, so as to travel along the trajectory formed by the traveling rails 712 and 713. As the means for feeding power to the vehicle, a battery may be mounted on the vehicle 701. When the battery is mounted on the vehicle, it is not required to provide the guide rails parallel to the feeder, and it is not required to cause the vehicle to travel along the trajectory formed by the traveling rails. For example, as a means for guiding the vehicle on the traveling path, a guidepath wire or a laser guided system may be used.

As shown in FIG. 22, as a means for positioning the vehicle 701 on the right and left sides with respect to the traveling path, upwardly projecting guide rails 712*b* and 712*b* (shown in FIG. 28) are formed on the traveling rail 712, and the traveling part 702 is provided with a guiding portion 708. The guiding portion 708 comprises guide wheels 717 and 717 contacting the guide rails 712*b* and 712*b* from the outside, and a supporting member for supporting the guide wheels 717 and 717. The supporting member 716 is fixed to the traveling part 702.

As shown in FIGS. 22 through 24, a single wafer transfer unit 705 for transferring a wafer 710 (shown in FIG. 24) to the central portion of the body is mounted on the vehicular body 703. On both sides of fore and aft of the single wafer transfer unit 705, a buffer cassette 706 is arranged.

Although the vehicle 701 is capable of traveling in both directions of fore and aft, it is assumed that the side of the aligner 704 is the fore of the vehicle 701.

Figure 25:
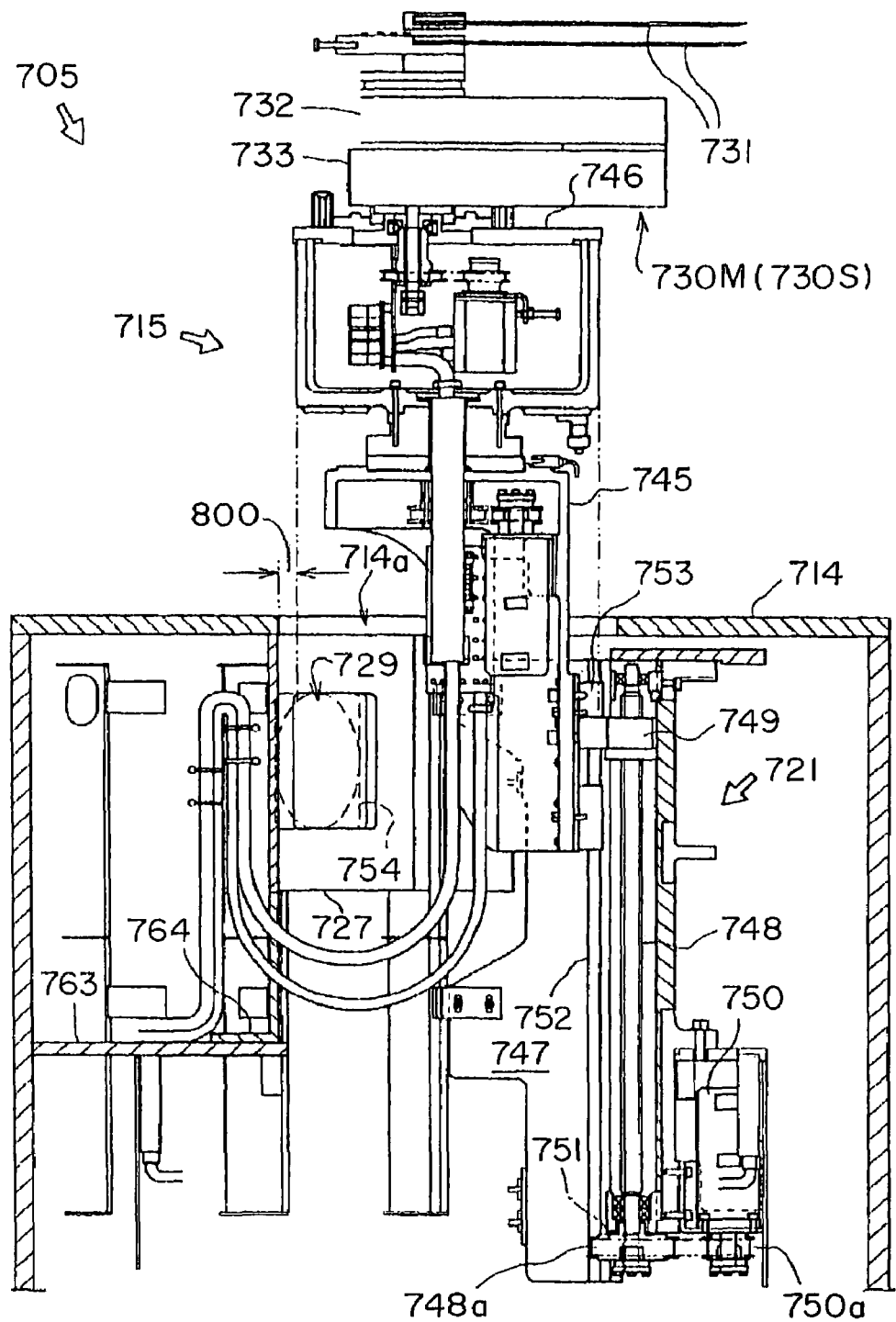
FIG. 25 is a front view showing the construction of a single wafer transfer unit.
Figure 26:
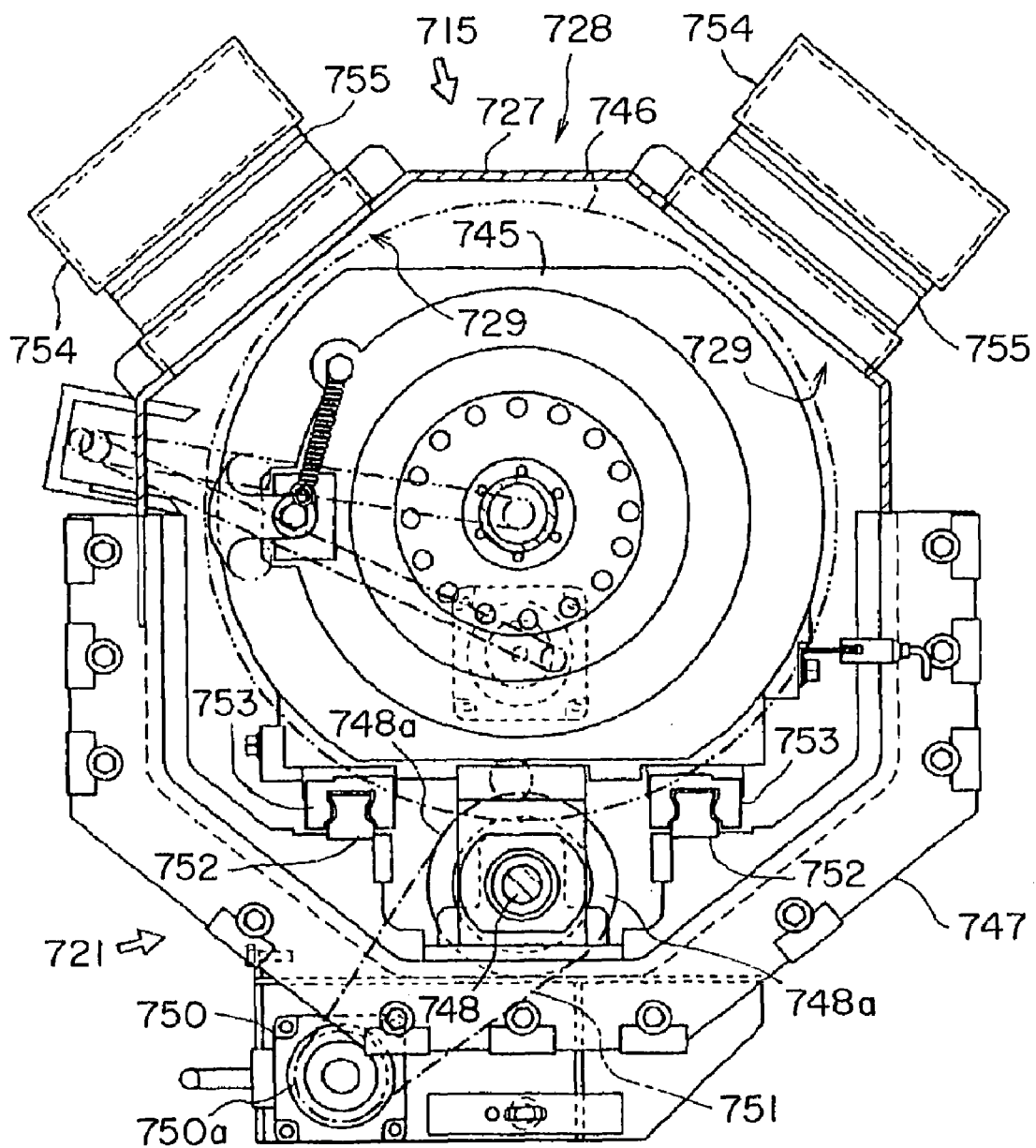
FIG. 26 is a plan view of a suction mechanism for sucking dust in a base portion and a lift driving portion.

Referring to FIGS. 23, 24, 25 and 26, the construction of the single wafer transfer unit 705 will be described below. FIG. 25 is a front view showing the construction of the single wafer transfer unit 705, and FIG. 26 is a plan view showing a suction mechanism for sucking dust in a base portion 721 and lift driving portion.

As shown in FIGS. 23, 24, 25 and 26, the single wafer transfer unit 705 comprises a base portion 721 provided on the vehicular body 703 (the above described vehicular body 703), and a lifting unit 715 capable of vertically moving along the base portion 721. The lifting unit 715 comprises a lift base frame 745, and a turn table 746 capable of rotating with respect to the lift base frame 745. The turn table 746 has two sets of robot hands 730M and 730S.

The robot hands 730M and 730S are means for moving an article (the wafer 710 in this preferred embodiment). By driving the lifting unit 715 with respect to the base portion 721, the robot hands 730M and 730S serving as transfer means move in vertical directions. By rotating the turn table 746 with respect to the lift base frame 745, the robot hands 730M and 730S serving as transfer means rotate.

Each of the robot hands 730M and 730S is a horizontally articulated scalar type robot hand which comprises a transfer hand 732 capable of supporting thereon the wafer 710, and first and second arms 732 and 733 for connecting the transfer hand 731 to the turn table 746. The robot hands 730M and 730S allow the transfer hand 731 to linearly extend and retract with respect to the turn table 746.

The transfer hand 731 is capable of supporting thereon the wafer 710 by the vacuum holding. In the top face of the transfer hand 731, a suction portion is formed. The single wafer transfer unit 705 is equipped with a suction means (not shown), such as an air pump.

The single wafer transfer unit 705 is capable of taking up and vacuum holding the wafer 710 by the transfer hand 731 to transfer the wafer 710 by the extension and retraction of the robot hands 730M and 730S and the rotation of the turn table 746. When the wafer 710 is mounted, the vacuum holding of the wafer 710 by the transfer hand 731 is released.

Referring to FIGS. 25 and 26, the lift driving portion of the lifting unit 715 of the single wafer transfer unit 705 will be described below.

The base portion 721 has a base frame 747 shown in FIGS. 25 and 26. The base frame 747 is fixed to the vehicular body 703. As shown in FIG. 26, the base frame 747 has a substantially U shape on a plane. In a space surrounded by the base frame 747, the lifting unit 715 is arranged.

In the base frame 747, a vertically extending screw shaft 748 is arranged and rotatably supported. The screw shaft 748 engages a nut 749. The nut 749 is fixed to the lift base frame 745 of the lifting unit 715.

Outside of the lower portion of the base frame 747, a lift driving motor 750 serving as a means for driving the screw shaft 748 is provided. A belt 751 is wound onto a pulley 750a, which is fixed to the motor shaft of the lift driving motor 750, and a pulley 748a which is provided on the lower end of the screw shaft 748. By the lift driving motor 750, the screw shaft 748 is driven.

The base frame 747 is provided with guide rails 752 and 752 in parallel to the screw shaft 748. The lift base frame 745 is provided with sliding members 753 and 753 capable of sliding on the guide rails.

The lift driving portion of the lifting unit 715 is thus constructed.

The lift driving portion of the lifting unit 715 is a dust source. In particular, when the lifting unit is moved in vertical directions, dust is produced from the engaging portion of the screw shaft 748 with the nut 749, and the sliding portion of the sliding member 753 on the guide rail 752. In addition, the contacting portions of the pulleys 748a and 750 with the belt 751 wound onto the pulleys 740a and 750a are dust sources.

As shown in FIGS. 24 and 25, a ceiling plate 714 for covering the top of the vehicular body 703 has a circular opening 714a in the center on a plane.

The lift base frame 745 and turn table 746 of the lifting unit 715 are formed so as to have a circular shape on a plane. The outside diameter of each of the lift base frame 745 and turn table 746 is smaller than the inside diameter of the opening 714a. Therefore, the lift base frame 745 and the turn table 746 are capable of passing through the opening to move in vertical directions.

As shown in FIGS. 24 and 25, a gap 800 is formed between the inner periphery of the opening 714a of the ceiling plate 714 and the outer periphery of the turn table 746. Thus, there is some possibility that air in the vehicular body 703 may leak above the ceiling plate 714 via the gap 800.

In particular, when the lifting unit 715 moves downwards, the lifting unit 715 allows air in the vehicular body 703 to intend to leak upwards via the gap 800 between the opening 714a and the turn table 746. At this time, dust produced between the screw shaft 748 and nut 749 of the lift driving portion curls up by the flow of compressed leakage air to leak above the ceiling plate 714 via the gap of the opening 714a.

Above the opening 714a, the robot hands 730M and 730S serving as transfer means are arranged. If the wafer 710 is arranged on the transfer hand 731, there are deficiencies that dust adheres to the wafer 710. Therefore, according to the present invention, a suction means (fan 754) for sucking dust produced in the lift driving portion of the single wafer transfer unit 705 is provided for preventing the occurrence of such deficiencies.

Referring to FIGS. 23, 24 and 26, the suction means will be described below.

First, a cylindrical body 728 for improving the suction effect of fans 754 and 754 serving as suction means will be described.

As shown in FIGS. 24 and 26, a cover 727 for covering the lifting unit 715 is provided on the side of the lifting unit 715. The cover 727 is mounted on a support 764 provided on a supporting frame 763 which is provided in the vehicular body 703 so as to extend fore and aft. The supporting frame is fixed to the vehicular body 703.

The cover 727 has a substantially U shape on a plane. On the side of the lifting unit 715, the base frame 747 of the base portion 721 is also arranged.

The cover 727 is combined with the base frame 747 to form the cylindrical body 728 surrounding the lifting unit 715. The cylindrical body 728 has a hexagonal shape on a plane. Each of the cover 727 and the base frame 747 has a shape formed by substantially dividing the hexagon of the cylindrical body 728 into two parts, and has a substantially U shape as described above.

The top of the cover 727 forming the cylindrical body 728 has openings 729 and 729. The openings 729 and 729 have ducts 755 and 755 to be communicated with the fans 754 serving as suction means, respectively. The fans 754 and 754 are fixed to the cover 727.

The fans 754 and 754 serving as suction means are designed to suck air around the gap 800 and the lift driving portion of the single wafer transfer unit 705.

The fans 754 and 754 are formed so that discharge ports for discharging air face downwards. Regardless of the directions of the discharge ports of the fans 754 themselves, a duct having a discharge port facing downwards may be connected to the fan 754 to discharge air downwards from the fan 754.

The bottom of the vehicular body 703 is open. Therefore, dust sucked by the fans 754 and 754 is discharged with downward discharge air to the floor face from the bottom of the vehicular body 703.

Therefore, dust containing air is discharged downwards, so that it is possible to effectively prevent dust from curling up to the position of the wafer 710 above the ceiling plate 714 of the automatic guided vehicle 701.

In this preferred embodiment, the cover 727 is provided for forming the cylindrical body 728 covering the lifting unit 715, so that a space communicated with the gap 800 can be formed between the lifting unit 715 and the cylindrical body 728. Then, by sucking air in the space by means of the fans 754 and 754, it is possible to more efficiently suck air around the gap 800.

By providing the fans 754 and 754 on the side of the lifting unit 715, dust produced in the lift driving portion of the lifting unit 715 is immediately sucked and removed by means of the fans 754 and 754 serving as suction means. In addition, dust falling onto the floor face in the vehicular body 710 without being sucked during the production of dust is sucked by the suction means when dust curls up by the vertical movement of the lifting unit 715. Moreover, it is possible to prevent dust containing air from leaking above the ceiling plate 714 of the vehicular body 703.

The outer periphery of the lifting unit 715 is surrounded by the cylindrical body 728, and air in the cylindrical body 728 is sucked by the fans 754 and 754 serving as suction means.

Therefore, if the fans 754 and 754 serving as suction means are driven, air flow from above and below of the cylindrical body 728 toward the openings 729 and 729 of the cylindrical body 728 is produced, so that air in the cylindrical body 728 is surely sucked. In particular, even if air flow intending to leak upwards from the gap 800 is produced by the vertical movement of the lifting unit 715, it is canceled by suction air flow toward the openings 729 and 729. Therefore, dust containing air is sucked by the fans 754 and 754, so that it is possible to prevent the air from leaking above the vehicular body 703.

The sucked air is carried by the discharged air flow to be discharged from the bottom of the vehicular body 703 to the outside. The automatic guided vehicle in this preferred embodiment is used in a clean room having a semiconductor wafer producing line or inspecting line. In the clean room, clean air flows from the ceiling toward a floor, such as a grated panel having vent holes. Therefore, dust containing air is carried by the flow of clean air to be discharged below the floor via the vent holes.

The fans 754 and 754 are arranged below the ceiling plate 714 and above the traveling driving portion which is arranged in the lower portion of the traveling part 702. The traveling driving portion is provided with the drive motor and the traveling wheels 709, 709, 709 and 709.

Therefore, dust produced in the traveling driving portion is also carried by the flow of downward air, which is discharged from the discharge ports of the fans 754 and 754, to be discharged downwards. As a result, it is possible to effectively inhibit dust, which is produced in the traveling driving portion, from curling up to the position of the wafer 710 above the ceiling plate 714, without the need of any special suction means for sucking dust in the traveling driving portion.

In this preferred embodiment, the opening of the cylindrical body 728 is formed in the upper portion of the cover 727. The position of the suction port (the opening of the cylindrical body 728) for sucking air by the suction means should not be limited to the cover 727, an opening may be formed in the base frame 747 of the base portion 721. If the suction port (the opening of the cylindrical body 728) of the suction means is formed in the base portion 721, it is possible to more effectively remove dust since the suction port is nearer to the dust sources (the screw shaft 748 and so forth) than that when the suction port is formed in the cover 727.

Figure 27:
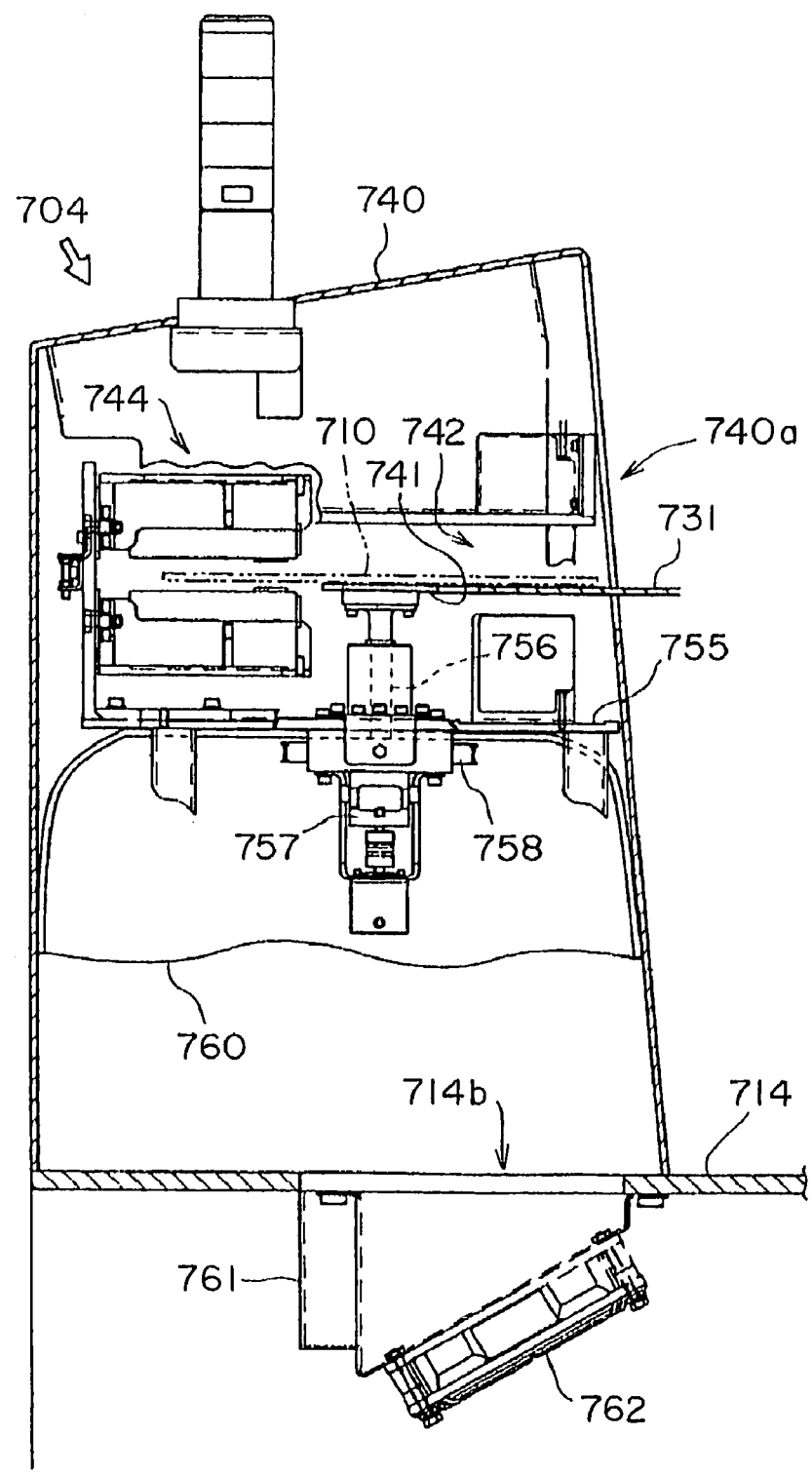
FIG. 27 is a side view of an aligner.

Referring to FIGS. 23, 24 and 27, the aligner 704 will be described below. FIG. 27 is a side view of the aligner 704.

The aligner 704 is a unit for aligning the attitude of the wafer 710 so that the wafer 710 can be transferred to a processing unit, such as an inspecting unit, in an assigned attitude by means of the single wafer transfer unit 705. The aligner 704 is designed to adjust the position and direction of the wafer 710 supported on the transfer hand 731 of the single wafer transfer unit 705.

The aligner 704 is arranged in front of the single wafer transfer unit 705. The aligner 704 is covered with a casing 740. Above the ceiling 714 of the vehicular body 703 in the casing 740, there is provided a supporting plate 755 supported on a support (not shown) which is provided on the ceiling plate 714 so as to extend upwards. Above the supporting plate 755, various units of the aligner 704 are provided. On the other hand, below the supporting plate 755, a driving part for the aligner 704 is provided.

On the supporting plate 755, a supporting table 741 for supporting thereon the wafer 710 is provided. The supporting table 741 is capable of vacuum holding the wafer 710 and is pivotable.

The back face of the casing 740 has an opening 740a for allowing the transfer hand 731 of the single wafer transfer unit 705 to move forwards so as to allow the wafer 710 to be mounted on the supporting table 741.

Below the supporting plate 755, the rotation driving portion of the supporting table is arranged. As shown in FIGS. 24 and 27, below the supporting plate 755 and on the side of the supporting table 741 (above in FIG. 24), a motor 754 serving as a means for rotating the supporting table 741 is arranged. A belt 759 (shown in FIG. 24) is wound onto a pulley 757a (shown in FIG. 24), which is provided on the motor shaft of the motor 757, and a pulley 758 which is provided on the lower end of a shaft 756 fixed to the supporting table 741. Thus, the rotation driving portion of the supporting table 741 is constructed. If the motor 757 is driven, the supporting table 741 rotates.

As shown in FIGS. 24, 25 and 28, the aligner 704, the aligner 704 is provided with peripheral position detecting sensors 742 and 743 as means for detecting the position of the wafer 710, i.e., as means for detecting whether the wafer 710 is mounted concentrically with the supporting table 741. In this preferred embodiment, the peripheral position detecting sensors 742 and 743 are optical sensors having a light emitting portion and a light receiving portion. The peripheral position detecting sensor 742 is a sensor for an 8-inch wafer, and the peripheral position detecting sensor 743 is a sensor for a 12-inch wafer. The peripheral position detecting sensor 743 is arranged outside of the peripheral position detecting sensor 742 with respect to the center of the supporting table 741 on a plane.

The wafer 710 is made of a single crystal of silicon, and has a substantially disk shape. The wafer 710 has an orientation, and has a cut-out, such as an orientation flat or notch in its outer peripheral edge portion for determining the orientation. On the top or bottom face of the wafer 710, an ID mark indicating a number given to the wafer 710 and its production history is marked. This ID mark is marked on the basis of the position of the cut-out. By rotating the wafer 710 with the supporting table 741 to the position of the periphery of the wafer 710 by means of the peripheral position detecting sensors 742 and 743, the displacement of the wafer 710 from the supporting table 741 is calculated, and the position of the orientation flat or notch is recognized.

If the wafer 710 is concentric with the supporting table 741, the results of detection of the peripheral position of the wafer 710 by the peripheral position detecting sensors 742 and 743 are constant regardless of the angle of rotation of the wafer 710. If the center of the wafer 710 is displaced from the center of the supporting table 741, the results of detection of the peripheral position of the wafer 710 by the peripheral position detecting sensors 742 and 743 are sine (cosine) curves with respect to the angle of rotation of the wafer 710.

The position of the cut-out is detected so that the position of the periphery is discontinuous or lower (shorter) than other portions.

As shown in FIG. 24, the aligner 704 is a means for identifying the wafer 710, and the ID sensor 744 is arranged in front of the supporting table 741 (inside of the single wafer transfer unit 705).

Detection by the peripheral position detecting sensor 742 (743) is carried out for detecting the ID mark by the ID sensor 744 to read data thereof. In order to read the ID mark by the ID sensor, the wafer 710 is moved from the supporting table 741 just above the ID sensor by means of the single wafer transfer unit 705. Since the ID mark is very small, the ID mark is preferably positioned just above the ID sensor.

Therefore, in order to the ID mark just above the ID sensor by means of the single wafer transfer unit 705 on the basis of the results of detecting using the peripheral position detecting sensor 742 (743), the supporting table 741 is rotated and stopped, and the wafer 710 on the supporting table 741 is taken up by means of the transfer hand 731 of the single wafer transfer unit 705 to be moved just above the ID sensor 744 by extending the transfer hand 731. Then, the ID sensor 744 is operated to detect and read the ID mark, and information, such as a number and production history, is stored in the control unit of the vehicle 701, so that the information, together with the wafer 710, is delivered to a processing unit, such as a producing unit or inspecting unit, when the wafer 710 is transferred to the processing unit.

The ID sensor 744 is not a transmission sensor, such as the above described peripheral position detecting sensor 742 (743). Therefore, it is not always required to provide a pair of upper and lower ID sensors if it is possible to detect a face to which the ID mark of the wafer 710 is given. If the ID mark is given to only one side, one ID sensor may be provided so as to be capable of detecting the ID mark, and if the ID mark is given to both sides, a pair of upper and lower ID sensors 744 may be provided.

The driving portion of the aligner 704 corresponds to the rotation driving portion of the supporting table 741. The rotation driving portion is a dust source. In particular, the contact portions of the pulleys 757a and 758 with the belt 759 wound onto the pulleys 757a and 758 are dust sources.

In order to prevent dust, which is produced in the driving portion of the aligner 704, from adhering to the wafer 710 vacuum-held onto the supporting table 741, the vehicle 701 is provided with a second dust sucking means.

The suction means (fans 754 and 754) for sucking dust produced from the lift driving portion of the single wafer transfer unit 705 is the first suction means, and the suction means for sucking dust produced in the driving portion of the aligner 704 is the second suction means.

As shown in FIGS. 24 and 27, a gap is formed between the casing 740 and the supporting plate 755. In order to prevent dust, which is produced in the rotation driving portion of the supporting table 741, from leaking upwards from the gap, a skirt member 760 is provided. In this preferred embodiment, The skirt member 760 is made of a soft resin having elasticity, and is fixed to the bottom face of the supporting plate 755. The end portion of the skirt member 760 hangs downwards to be pulled in lateral directions due to the elasticity itself to contact the casing 740. Then, the end portion of the bottom skirt member 760 closes the gap between the supporting plate 755 and the casing 740 to prevent dust containing air from leaking from the gap.

The supporting plate 755 has a through hole (not shown) for supporting thereon the supporting table 741 and for allowing the passage of the shaft 756 transmitting the rotation driving force. The inside diameter of the through hole of the supporting table 755 is larger than the outer diameter of the shaft 756 so as not to obstruct the driving rotation of the shaft 756. Therefore, there is some possibility that dust containing air may leak above the supporting plate 755 via a gap between the through hole and the shaft 756.

As shown in FIGS. 23, 24 and 27, the second suction means (fan 762) is provided below the ceiling plate 714 of the vehicular body 703. The ceiling plate 714 has an opening 714b below the aligner 704. The opening 714b is communicated with the fan 762 serving as suction means.

Air in a space surrounded by the casing 740, supporting plate 755, skirt member 760 and ceiling plate 714 is sucked into the fan 762 serving as suction means. In this space, the rotation driving portion of the supporting table 741 serving as the driving portion of the aligner 704 is arranged. Air around the rotation driving portion is sucked into the fan 762 to remove dust.

The space around the rotation driving portion is substantially closed, except for the gap between the through hole and the shaft 756. In accordance with the decrease of air pressure due to the suction of air by the fan 762, the skirt member 762 of a soft material deflects to allow outside air to enter. Specifically, air enters from the opening 740a of the casing 740. Thus, the air pressure in the space is held to be constant regardless of the driving of the fan 762.

Therefore, if the fan 762 serving as the second suction means is driven, air around the driving portion of the aligner 704 (the rotation driving portion of the supporting table 741) is sucked into the fan 762. Simultaneously, air flow is produced from the upper supporting table 741 toward the lower fan 762. Then, dust produced in the driving portion is removed.

Since the skirt member 760 is formed of a soft material, the skirt member 760 deflects in accordance with the decrease of air pressure due to the suction of air by the fan 762, to allow outside air (air above the supporting plate 755) to enter the substantially closed space around the driving portion. Since downward air also flows in the gap between the through hole of the supporting plate 755 and the shaft 756 of the supporting table 741, dust containing air does not leak toward the supporting table 741 via the gap.

Therefore, when the attitude of the wafer 710 is adjusted by the aligner 704, the aligner 704 does not cause dust to adhere to the wafer 710.

The buffer cassette 706 is a unit for housing therein a plurality of wafers 710 on the side of the vehicle 701. As shown in FIG. 23, the buffer cassette 706 is supported on the supporting table 735 provided on the top face of the vehicular body 703.

The front side of the buffer cassette 706 (the side facing the single wafer transfer unit 705) is open so as to be capable of receiving the transfer hand 731 of the single wafer transfer unit 705 to house the wafer 710 therein. In the buffer cassette 706, ribs 736 and 736 capable of horizontally supporting thereon the side edges of the wafer 710 are provided on the right and left sides with respect to the opening, so as to form a large number of shelves. Thus, a large number of wafers 710 can be horizontally housed in the buffer cassette 706.

Therefore, the large number of wafers 710 can be housed in the vehicle 701 during the transfer operation of the wafers 710 to transfer and processing units by the vehicle 701.

Referring to FIG. 28, the construction of a non-contact feeding to the vehicle 701 will be described below. FIG. 28 is a front view of a principal part of the vehicle 701, which shows the construction of a non-contact feeding.

Feeders 718 and 718 are laid along the traveling rail 712. On the other hand, the vehicle 701 is provided with a receiving unit 719. The receiving unit 719 is provided with a core 725 for amplifying a magnetic field produced by the feeders 718. Onto the core 725, a pick-up coil 726 for taking out power from the magnetic field produced in the core 725 is wound. The pick-up coil 726 is connected to a power supply portion in the vehicle 701. With this construction, the vehicle 710 can take out power from the feeders 718 in a non-contact form.

The pair of feeders 718 and 718 forming an approach route and a return route are arranged along the traveling rail 712. That is, the direction of current in each of the feeders 718 and 718 is opposite to each other, and the direction of the magnetic field produced outside of each of the feeders 718 is also opposite to each other. The feeders 718 and 718 are arranged so as to make the magnetic field produced by the feeders 718 and 718 stronger.

The feeders 718 and 718 are supported on a feeder holder 707 provided on the traveling rail 712.

As described above, according to the third invention, since the suction means for sucking and removing dust produced in and around the mounted driving portions is provided in the vicinity of at least one of the driving portions, dust produced in a driving portion, such as the lift driving portion of the single wafer transfer unit, can be sucked by the suction means, so that it is possible to prevent dust, which is produced in the driving portion, from leaking to the outside from the interior of the vehicle.

The single wafer transfer unit has the lifting unit having transfer means. The lift driving portion for vertically moving the lifting unit is provided on the base portion mounted on the vehicular body. The upper portion of the base portion is covered with the ceiling plate having the opening for allowing the passage of the lifting unit. The suction means is provided for sucking air around the gap between the lifting unit and the opening. Therefore, if the suction means sucks air around the gap between the lifting unit and the opening of the ceiling plate, it is possible to suck dust produced in the lift driving portion, and it is possible to suck dust which intends to leave the ceiling plate to the outside with the flow or air produced by the vertical movement of the lifting unit, so that it is possible to surely suck dust in the lift driving portion.

The aligner is provided for adjusting the attitude of wafers, and the suction means is provided for sucking air around the driving portion of the aligner. Therefore, air around the driving portion of the aligner is sucked into the second suction means. Thus, dust produced in the driving portion is removed.

It is possible to deliver the wafer to the processing unit after adjusting the attitude of the wafer by the aligner, so that it is not required to provide any aligners of the processing unit. Moreover, it is possible to suck dust, which is produced in the driving portion of the aligner, into the suction means, so that it is possible to prevent dust from adhering to the wafer while the attitude of the wafer is adjusted by the aligner.

Since air sucked into the suction means is discharged below the vehicular body, dust containing air is discharged downwards, so that is it possible to effectively dust from curling up to the position of the wafer above the ceiling plate of the automatic guided vehicle.

Since the traveling driving portion is arranged on the bottom of the vehicular body and since the air outlet of the suction means is arranged above the traveling driving portion, it is possible to discharge dust, which is produced in the traveling driving portion having the traveling wheels for moving the automatic guided vehicle and the drive motor for driving the traveling wheels, from being discharged below the vehicular body with the air flow from the air outlet. Therefore, it is not required to provide any special suction means for removing dust produced in the traveling driving portion.

The invention claimed is:

1. A transfer system for an object to be processed, said system comprising:
    a host computer for managing production of a semiconductor device;
    a plurality of semiconductor producing units for producing a semiconductor device from an object to be processed, under control of said host computer;
    a plurality of automatic transfer units, each of which automatically transfers said object along the same trajectory to deliver said object to a corresponding one of said semiconductor producing units and to receive said object from said corresponding one of said semiconductor producing units, one by one, at the request of said corresponding one of said semiconductor producing units, the plurality of automatic transfer units moving in synchronism with each other along the same trajectory; and
    a transfer operating unit, associated with said host computer, for operating said plurality of automatic transfer units,
    wherein said transfer operating unit has a control part having a scheduler and dispatcher for preparing an operating schedule for each of said automatic transfer units on the basis of the relationship in position between each of said semiconductor producing units and each of said automatic transfer units, for determining optimum transfer paths for said automatic transfer units, and for assigning a corresponding one of said automatic transfer units to a corresponding one of said optimum transfer paths, and said transfer operating unit updates an operating schedule of operating said plurality of automatic transfer units in accordance with a sequentially varying inspection status.

2. A transfer system for an object to be processed, as set forth in claim 1, wherein said scheduler and dispatcher controls movement of each of said automatic transfer units in a direction.

3. A transfer system for an object to be processed, as set forth in claim 1, wherein said scheduler and dispatcher predicts a moving time for each of said automatic transfer units.

4. A transfer system for an object to be processed, as set forth in claim 1, wherein said scheduler and dispatcher dynamically assigns each of said automatic transfer systems in accordance with an operating condition of each of said semiconductor producing units.

5. A transfer system for an object to be processed, as set forth in claim 1, wherein said scheduler and dispatcher assigns each of said automatic transfer units to a corresponding one of said optimum transfer paths in view of a delivery preference of said object and a moving time of a corresponding one of said automatic transfer units.

6. A transfer system for an object to be processed, as set forth in claim 1, wherein said scheduler and dispatcher sets a transfer prohibited area on said trajectory.

* * * * *